US012563798B2

(12) United States Patent
Tsai et al.

(10) Patent No.: US 12,563,798 B2
(45) Date of Patent: Feb. 24, 2026

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Ming-Heng Tsai, Taipei (TW);
Chun-Sheng Liang, Changhua (TW);
Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 500 days.

(21) Appl. No.: 18/099,732

(22) Filed: Jan. 20, 2023

(65) Prior Publication Data

US 2024/0250161 A1        Jul. 25, 2024

(51) Int. Cl.
H10D 62/10 (2025.01)
H10D 30/67 (2025.01)
H10D 64/01 (2025.01)

(52) U.S. Cl.
CPC ....... H10D 62/121 (2025.01); H10D 30/6735 (2025.01); H10D 64/017 (2025.01)

(58) Field of Classification Search
CPC ........... H10D 30/6735; H10D 30/6757; H10D 64/017; H10D 62/121; H10D 30/014; H10D 30/43
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2020/0266192 A1* | 8/2020 | Ju ........................ | H10D 84/834 |
| 2022/0344461 A1* | 10/2022 | Jung .................... | H10D 62/118 |

* cited by examiner

*Primary Examiner* — Changhyun Yi
(74) *Attorney, Agent, or Firm* — NZ Carr Law Office

(57) ABSTRACT

Embodiments of the present disclosure provide a semiconductor device structure. In one embodiment, the semiconductor device structure includes a plurality of semiconductor layers vertically stacked over a substrate, a source/drain feature in contact with each of the plurality of the semiconductor layers, a gate electrode layer surrounding a portion of each of the plurality of the semiconductor layers, a source/drain contact disposed above the source/drain feature, a gate spacer disposed between the gate electrode layer and the source/drain contact, and an isolation structure extending through the gate electrode layer. The isolation structure includes a first portion having three sides covered by the gate electrode layer, the first portion having a top surface at a first elevation, and a second portion extended outwardly from the first portion, the second portion having a top surface at a second elevation that is lower than the first elevation.

20 Claims, 31 Drawing Sheets (Alternative Embodiment)

100

100

SEMICONDUCTOR DEVICE HAVING NANOSHEET TRANSISTOR AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel are surrounded by the gate electrode, which allows for fuller depletion in the channel and results in less short-channel effects and better gate control. As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-9A are cross-sectional side views of various stages of manufacturing the semiconductor device structure taken along line A-A of FIG. 6, in accordance with some embodiments.

FIGS. 7B-9B are cross-sectional side views of various stages of manufacturing the semiconductor device structure taken along line B-B of FIG. 6, in accordance with some embodiments.

FIGS. 14A-22A are cross-sectional side views of various stages of manufacturing the semiconductor device structure taken along line A-A of FIG. 13, in accordance with some embodiments.

FIGS. 14B-22B are cross-sectional side views of various stages of manufacturing the semiconductor device structure taken along line B-B of FIG. 13, in accordance with some embodiments.

FIG. 16B-1 is an enlarged view showing a region adjacent the recessed fin structures of a portion of the semiconductor device structure, in accordance with some embodiments.

FIGS. 14C-22C are cross-sectional side views of various stages of manufacturing the semiconductor device structure taken along line C-C of FIG. 13, in accordance with some embodiments.

DETAILED DESCRIPTION

Figure 1:
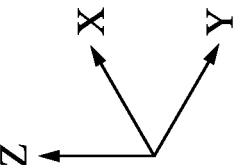
FIGS. 1-6 are perspective views of various stages of manufacturing a semiconductor device structure, in accordance with some embodiments.
Figure 1:
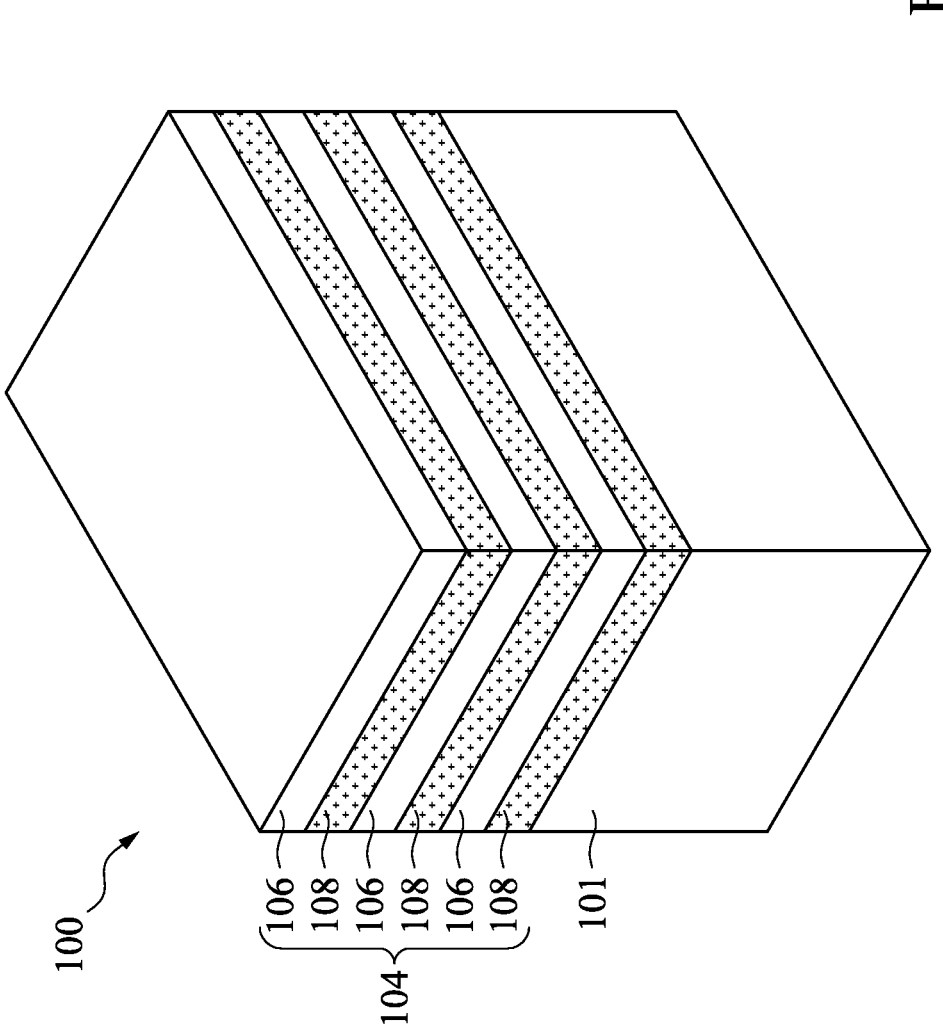

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-21F show exemplary processes for manufacturing a semiconductor device structure 100 according to embodiments of the present disclosure. It is understood that additional operations can be provided before, during, and after processes shown by FIGS. 1-21F, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having P-type or N-type conductivity). Depending on circuit design, the dopants may be, for example boron for a P-type field effect transistors (PFET) and phosphorus for a N-type field effect transistors (NFET).

The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108 vertically stacked over the substrate 101. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanosheet or nanostructure channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
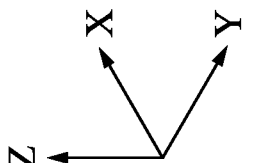
Figure 2:
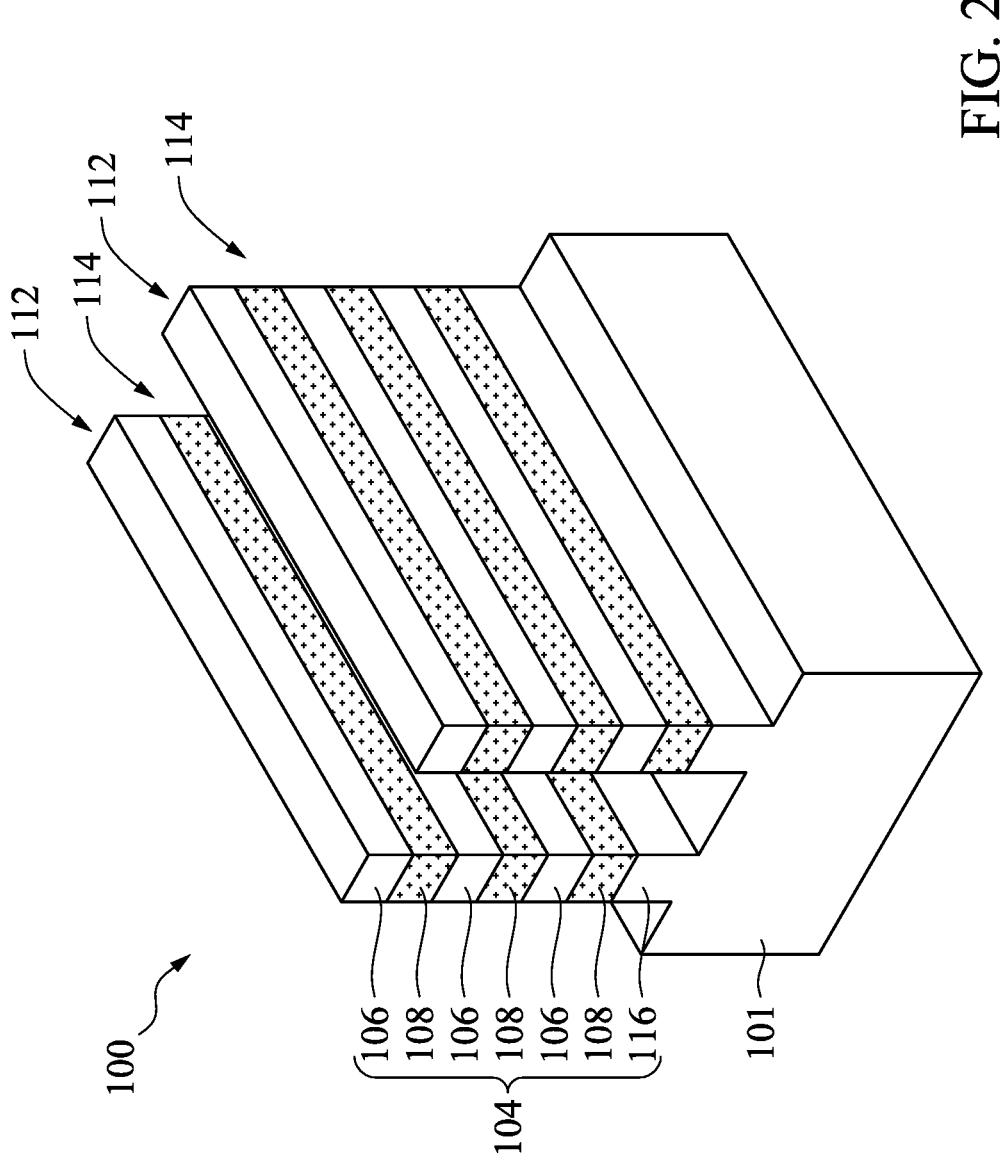
Figure 3:
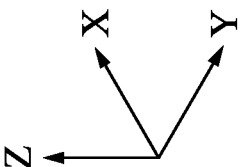
Figure 3:
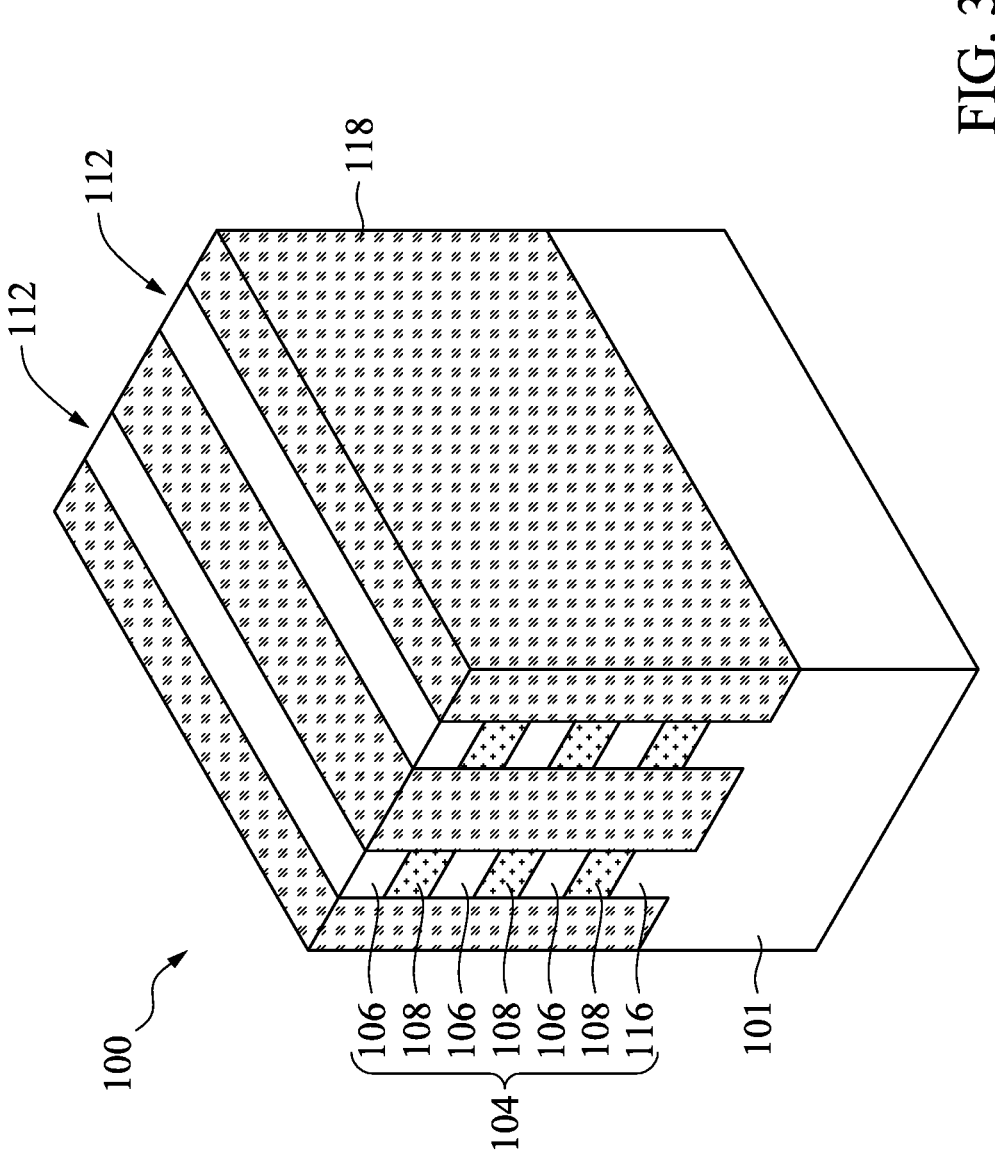

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof. In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
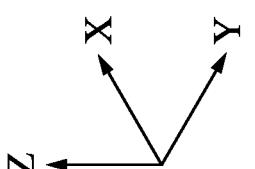
Figure 4:
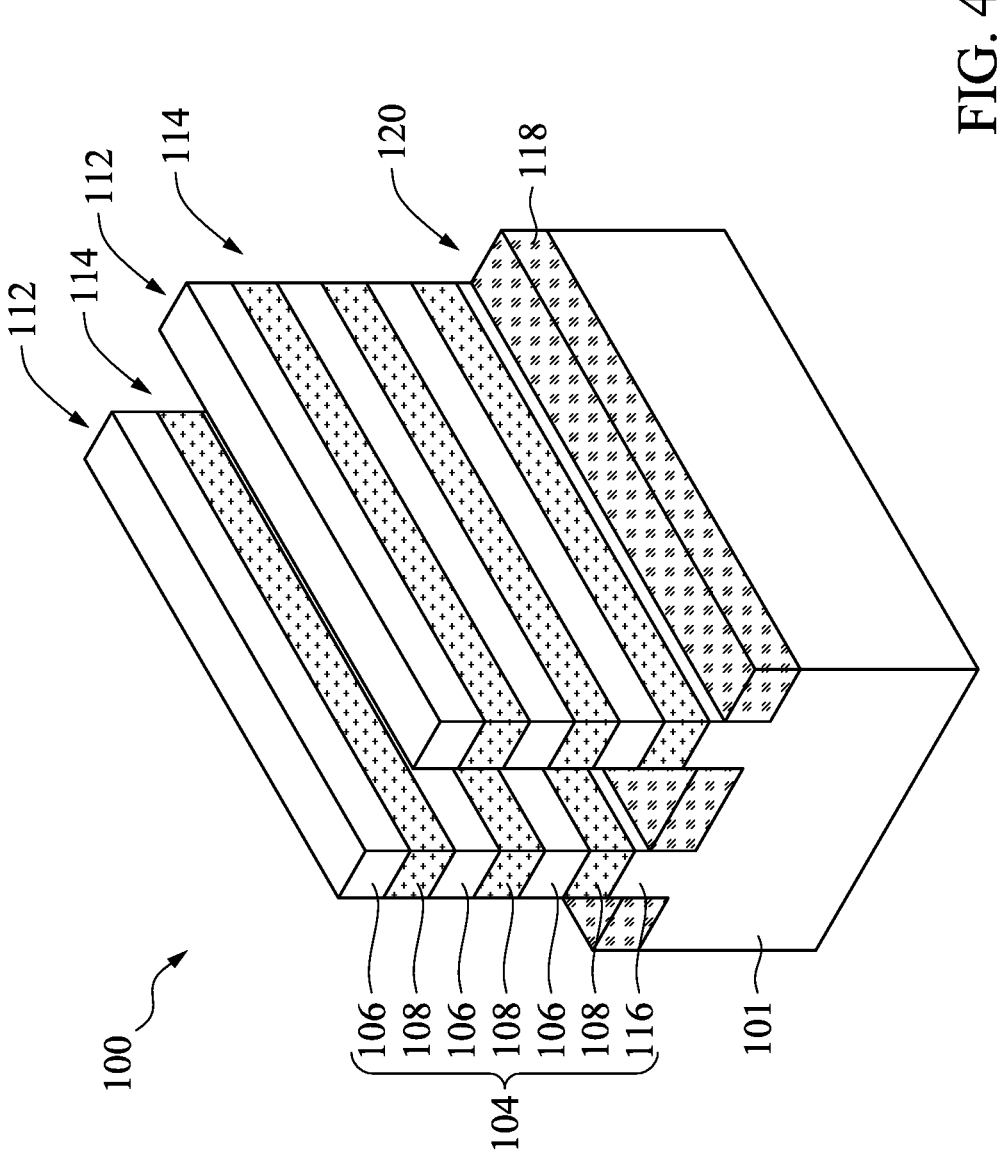

In FIG. 4, the insulating material 118 is recessed to form an isolation region 120 (i.e., shallow trench isolation (STI)).

The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or below a surface of the bottommost second semiconductor layers 108 in contact with the well portion 116.

Figure 5:
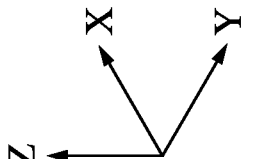

In FIG. 5, a sacrificial gate material 115 is formed on the fin structures 112 and the isolation regions 118. In some embodiments, a sacrificial gate dielectric layer (not shown) may be first formed on the fin structures 112 and the isolation regions 118, and the sacrificial gate material 115 is formed on the sacrificial gate dielectric layer. The sacrificial gate dielectric layer is configured to cover and protect the fin structures 112 during the subsequent etching processes for forming an isolation structure (i.e., cut poly-gate (CPO) structure). In such cases, the sacrificial gate dielectric layer and the sacrificial gate material 115 have different etch selectivity such that the sacrificial gate dielectric layer remains after etching the sacrificial gate material 115. The sacrificial gate dielectric layer may have a thickness in a range of about 1 nm to about 4 nm, and may include silicon oxide, silicon nitride, or the like, or a combination thereof. The sacrificial gate dielectric layer may be deposited or thermally grown by any techniques, such as CVD, PVD, ALD, or other suitable process.

After the optional sacrificial gate dielectric layer is deposited, the sacrificial gate material 115 is then deposited on the sacrificial gate dielectric layer (or on the fin structures 112 and the isolation regions 118) and then planarized by a planarization operation, such as a chemical mechanical polishing (CMP) process. The sacrificial gate material 115 may include silicon, such as polycrystalline silicon (poly-Si), amorphous silicon (a-Si), poly-crystalline silicon-germanium (poly-SiGe), or the like. In some embodiments, after the planarization process, the sacrificial gate material 115 between a top surface of the sacrificial gate material 115 and a top surface of the topmost first semiconductor layer 106 may have a thickness T1 in a range of about 10 nm to about 200 nm, for example about 15 to about 35 nm. The sacrificial gate material 115 may be deposited using CVD, LPCVD, FCVD, PECVD, PVD, ALD, or other suitable deposition process.

Figure 6:
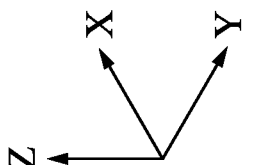

In FIG. 6, one or more isolation structures 117 (only one is shown) may be formed in the sacrificial gate material 115. The isolation structure 117 may be referred to as cut-poly-gate (CPO) structure. The isolation structure 117 is formed between the fin structures 112 and over a top surface of the sacrificial gate material 115. As will be discussed in more detail below, the isolation structures 117 at the gate regions are configured to separate a subsequent metal gate into discrete segments (FIG. 21C). Depending on the applications, the isolation structures 117 may also electrically isolate devices subsequently formed from the fin structures 112 on either side of the isolation structures 117 at the source/drain regions. In some embodiments, the isolation structures 117 at the source/drain regions may prevent undesirable lateral merging of epitaxial source/drain features formed on adjacent fin structures 112. In various embodiments, the isolation structures 117 extend through the entire thickness of sacrificial gate material 115 and into a portion of the isolation region 120. In some embodiments, the isolation structure 117 in the isolation region 120 may have a thickness T2 in a range of about 6 nm to about 20 nm, for example about 10 nm. Greater or less thickness T2 is contemplated, depending on the thickness of the insulating material 118. In some embodiments, the isolation structure 117 may stop at an interface between the sacrificial gate material 115 and the insulating material 118. In some embodiments, the isolation structure 117 may extend through the sacrificial gate material 115 and the insulating material 118 and into a portion of the substrate 101.

The isolation structures 117 may be formed by forming one or more openings or trenches in the sacrificial gate material 115. The openings are located at predetermined regions and may be defined by a patterned hard mask layer (not shown) deposited on the sacrificial gate material 115. The openings may extend along the X-direction between the adjacent fin structures 112. Once the patterned hard mask layer is formed, an etching process, which may be a dry etch process, a wet etch process, or a combination thereof, is performed using the patterned hard mask layer as a mask. The removal of the sacrificial gate material 115 forms the openings in the sacrificial gate material 115. The openings are then filled with an isolation material, which can be a nitride-based or oxide-based material. Suitable isolation materials may include, but are not limited to, $SiO_2$, SiN, SiCN, SiCON, SiCO, AlO, HfO, other dielectric material. The isolation material may also be a composite with multi-layers of the above-mentioned materials. The isolation material overfills the openings and is deposited to a height over the sacrificial gate material 115.

Figure 7B:
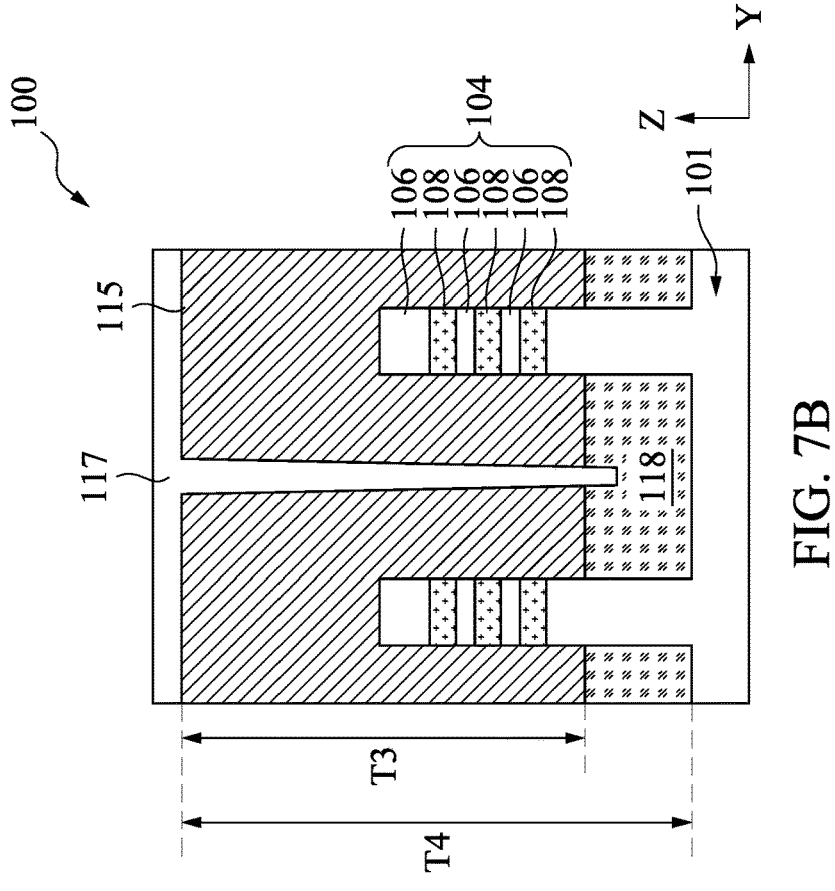
Figure 7A:
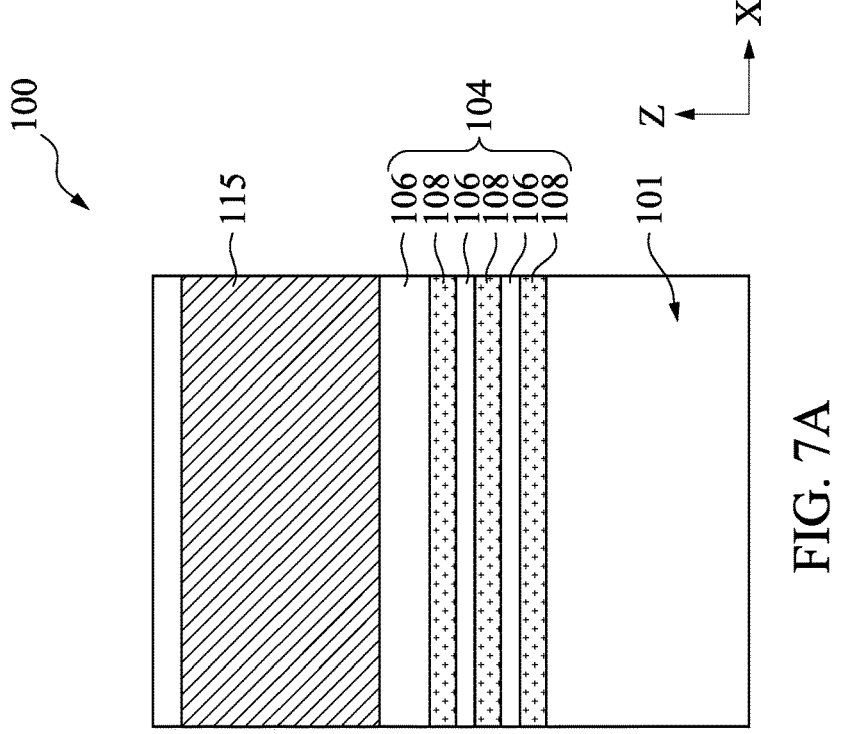

FIGS. 7A-9A are cross-sectional side views of various stages of manufacturing the semiconductor device structure 100 taken along line A-A of FIG. 6, in accordance with some embodiments. The line A-A illustrates a cross-section along a fin structure 112. FIGS. 7B-9B are cross-sectional side views of various stages of manufacturing the semiconductor device structure 100 taken along line B-B of FIG. 6, in accordance with some embodiments. The line B-B illustrates a cross-section in the source/drain (S/D) regions. As shown in FIGS. 7A and 7B, the sacrificial gate material 115 may have a thickness T3 and the isolation structure 117 in the sacrificial gate material 115 may have a thickness T4 greater than the thickness T3. However, the thickness T4 may be equal to or smaller than the thickness T3, depending on the application. In some embodiments, the thickness T3 of the sacrificial gate material 115 is about 40% to about 60% shorter than the thickness of the traditional sacrificial gate material (i.e., dummy gate). As will be discussed in more detail below, a shorter sacrificial gate material 115 allows easier patterning, etching, and deposition processes associated with forming the isolation structures 117 in the sacrificial gate material 115. Particularly, since the isolation structures 117 are formed before the sacrificial gate structures (e.g., sacrificial gate structures 130 in FIG. 11) are defined, no additional gate height is needed to compensate for the gate height loss that would otherwise occur if the gate-cut process were to perform after the sacrificial or replacement gate structure is formed. Therefore, the demand for the gate height is minimum or not required.

Figure 8B:
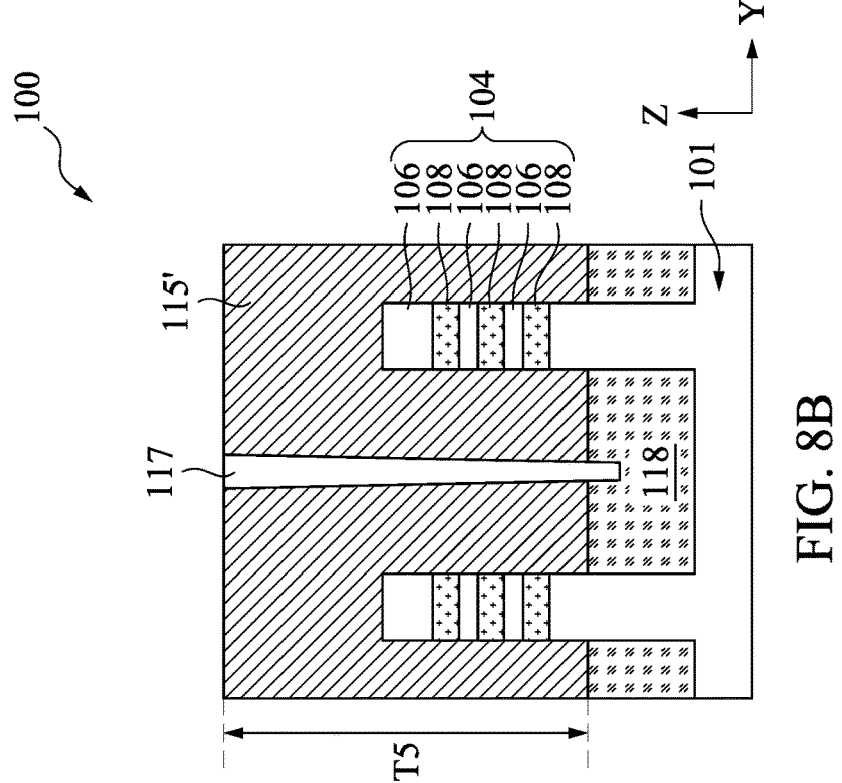
Figure 8A:
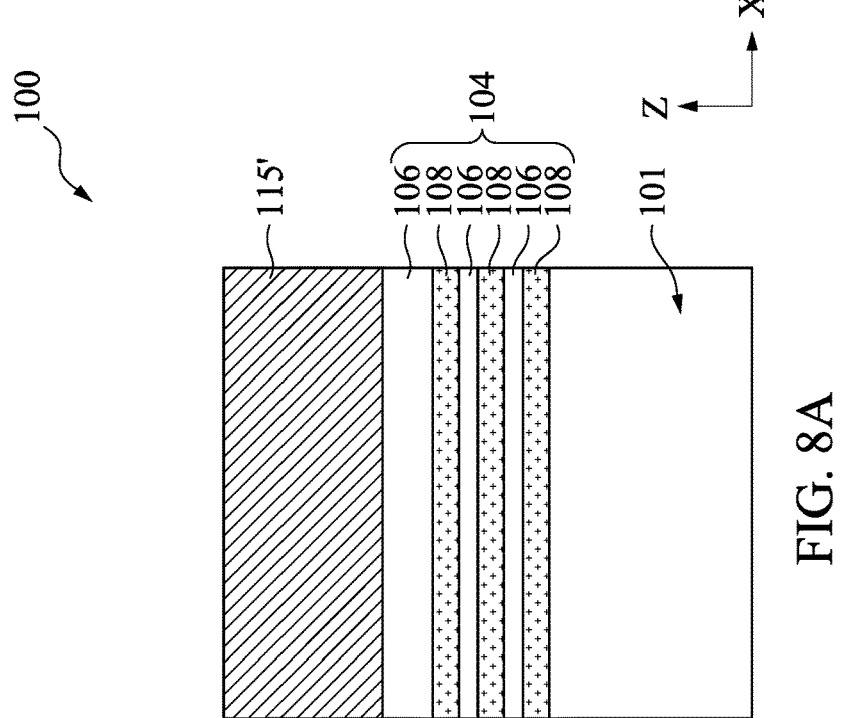

In FIGS. 8A-8B, once the isolation structures 117 are formed, a planarization process, such as the CMP process, is performed to remove portions of the isolation structures 117 over the top surface of the sacrificial gate material 115. The planarization process may be performed until the sacrificial gate material 115 is exposed. In some embodiments, the planarization process may also remove a portion of the sacrificial gate material 115. The removal of the sacrificial gate material 115 reduces the thickness of the sacrificial gate material 115 (now sacrificial gate material 115') from the thickness T3 (FIG. 7B) to the thickness T5. In some embodiments, the thickness T5 may be about 2 nm to about 8 nm shorter than the thickness T3, for example about 5 nm.

Figure 9B:
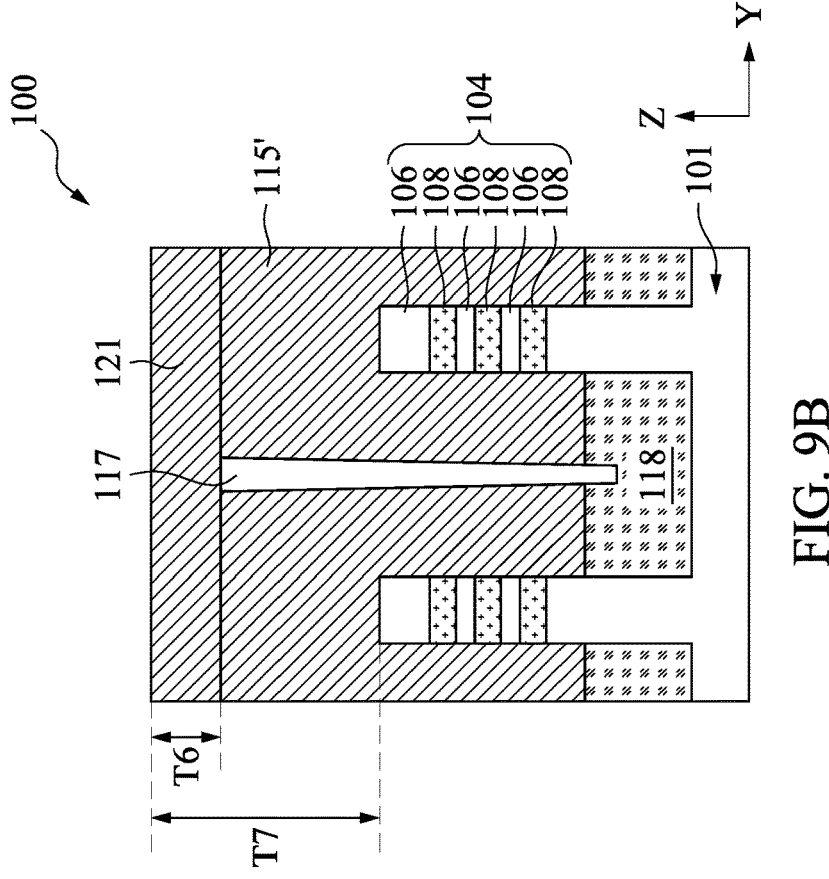
Figure 9A:
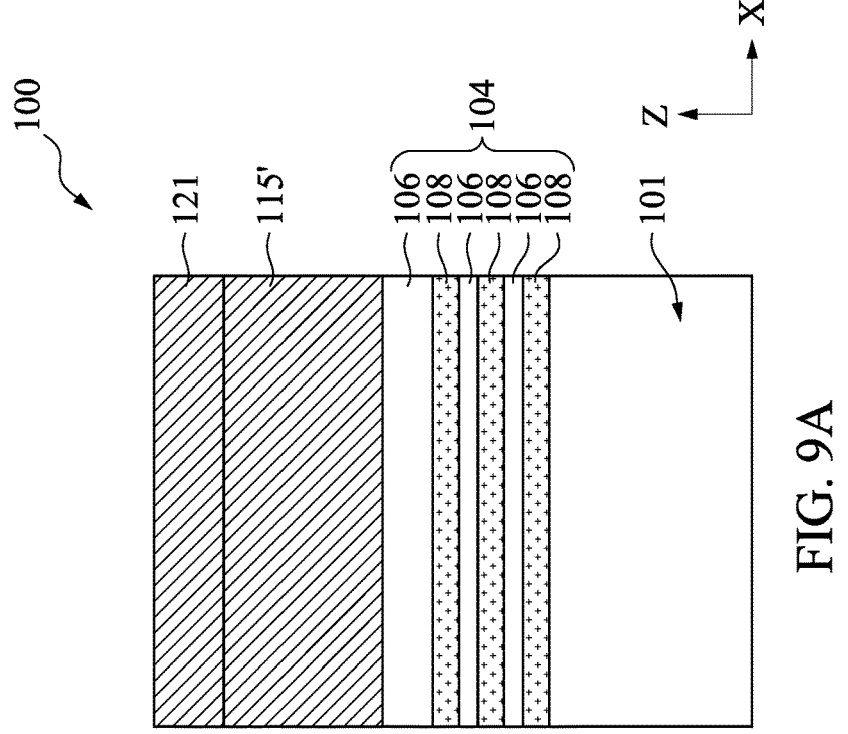

In FIGS. 9A-9B, an optional second sacrificial gate material 121 is formed on the planarized sacrificial gate material 115' and the isolation structures 117. The second sacrificial gate material 121 is deposited to compensate for the gate height loss that may occurred during the removal of the portions of the sacrificial gate material 115 and the isolation structures 117. In some embodiments, the second sacrificial gate material 121 may have a thickness T6 in a range of about 30 nm to about 50 nm, for example about 40 nm. In some embodiments, the second sacrificial gate material 121 and the planarized sacrificial gate material 115' between a top surface of the second sacrificial gate material 121 and the top surface of the topmost first semiconductor layer 106 may have a thickness T7 in a range of about 50 nm to about 70 nm, for example about 60 nm. The thickness T7 may be equal to, smaller, or greater than the thickness T3 (FIG. 5). In one embodiment, the thickness T7 is less than the thickness T3. The second sacrificial gate material 121 may be deposited using the same deposition process as the sacrificial gate material 115.

Figure 10:
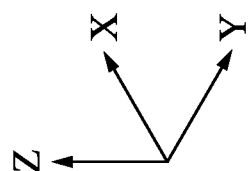
FIGS. 10-13 are perspective views of one of the various stages of manufacturing the semiconductor device structure, in accordance with some embodiments.

FIGS. 10-13 are perspective views of one of the various stages of manufacturing the semiconductor device structure 100, in accordance with some embodiments. In FIG. 10, one or more gate mask stacks 123 (only one is shown) are formed over the second sacrificial gate material 121. The gate mask stacks 123 are used to define sacrificial gate stacks 130 (FIG. 11) that are subsequently formed. The gate mask stacks 123 may be patterned, using any suitable photolithography technique, to form sacrificial gate stacks with various gate lengths. For example, the gate mask stacks 123 with greater gate length (e.g., about 20 nm to about 10 nm) may be formed at regions where I/O devices or devices with higher speed requirements are desired, and the gate mask stacks 123 with shorter gate length (e.g., about 10 nm to about 20 nm) may be formed at regions where system-on-chip (SOC) core devices are desired. The gate mask stacks 123 may each include an anti-reflective coating (ARC) 125, a mask layer 127, and a mandrel layer 129. The ARC 125 is deposited on the second sacrificial gate material 121 (or on the planarized sacrificial gate material 115' if the second sacrificial gate material 121 is not used). The ARC 125 may be formed from SiON, SiC, materials doped with oxygen (O) and nitrogen (N), or the like. In some embodiments, the ARC 125 is substantially free from nitrogen, and may be formed from an oxide. The ARC 125 may have a thickness in a range of about 15 nm to about 25 nm.

The mask layer 127 is deposited over the ARC 125. The mask layer 127 may be formed of a hard masking material, such as a metal and/or a dielectric material. Suitable material for the mask layer 127 may include, but is not limited to, a metal such as titanium nitride, titanium, tantalum nitride, tantalum, or the like, a dielectric material such as an oxide, a nitride, or the like. The mask layer 127 may be formed by PVD, radio frequency PVD (RFPVD), ALD, or the like. In some embodiments, the mask layer 127 may have a thickness in a range of about 80 nm to about 110 nm.

The mandrel layer 129 is deposited over the mask layer 127. The mandrel layer 129 may be formed of a material that has a high etching selectivity with the underlying layers, e.g., the mask layer 127. The mandrel layer 129 may include amorphous silicon, polysilicon, silicon nitride, silicon oxide, the like, or a combination thereof, and may be formed using CVD, PECVD, or any suitable deposition technique. In some embodiments, the mandrel layer 129 may have a thickness in a range of about 80 nm to about 110 nm.

Figure 11:
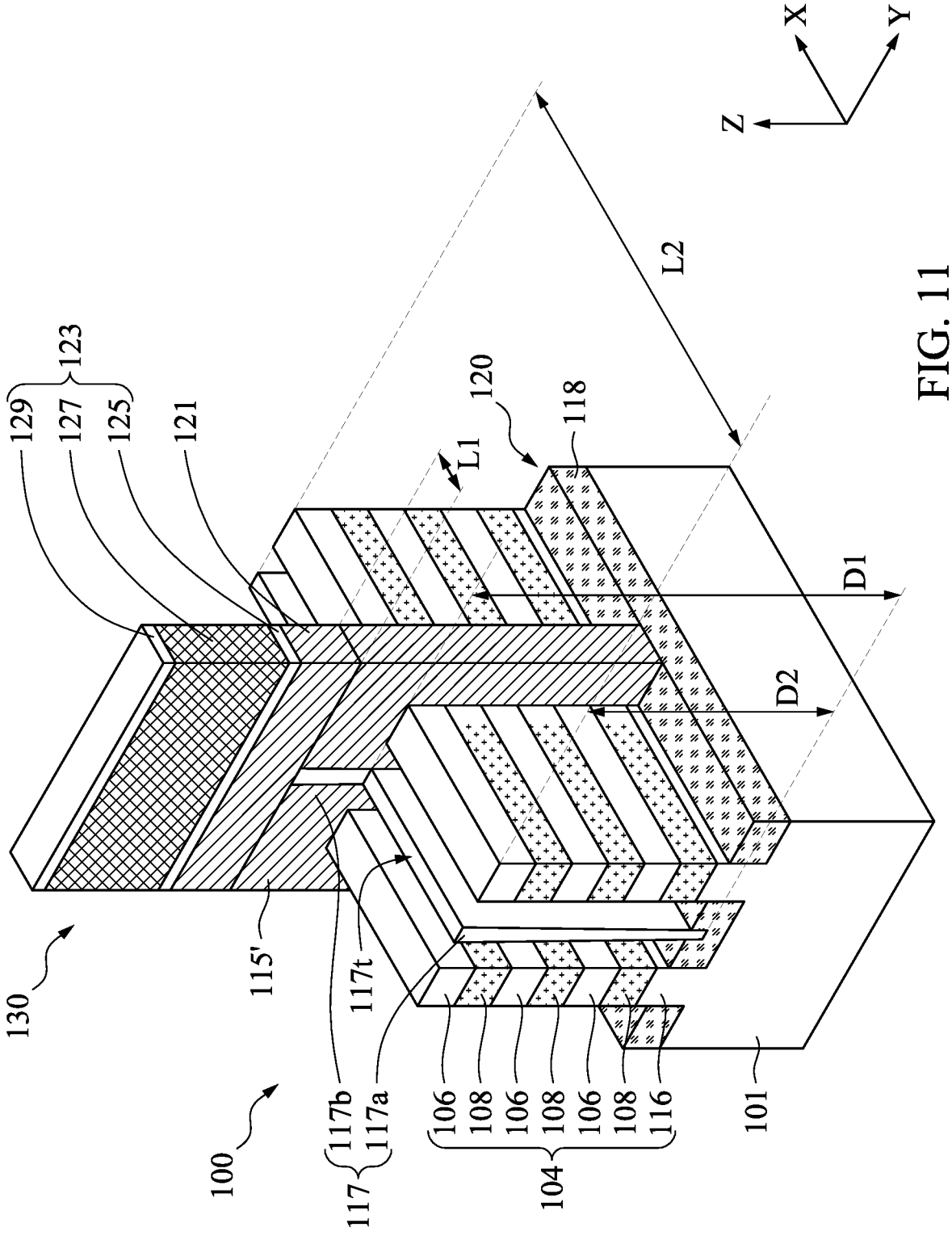

In FIG. 11, the second sacrificial gate material 121 and the sacrificial gate material 115' are etched, using the gate mask stacks 123 as a mask, by one or more etch processes to form sacrificial gate structures 130. Each sacrificial gate structure 130 covers a portion of the fin structure 112 and the isolation structure 117. The etchants used by the one or more etching processes are selective so that they etch the second sacrificial gate material 121 and the sacrificial gate material 115' without substantially affecting the stack of semiconductor layers 104 and the insulating material 118. The fin structures 112 that are partially exposed on opposite sides of the sacrificial gate structure 130 define source/drain (S/D) regions for the semiconductor device structure 100. The one or more etching processes may be performed until the second sacrificial gate material 121 and the sacrificial gate material 115' at the S/D regions are removed. The one or more etching processes may also remove a portion of the isolation structures 117 not covered by the sacrificial gate mask stacks 123. The sacrificial gate dielectric layer (if used) may serve as an etch stop to protect the fin structures 112 during the one or more etch processes. While one sacrificial gate structure is shown, two or more sacrificial gate structures 130 may be arranged along the X-direction in some embodiments.

After the one or more etching processes, portions of the first and second semiconductor layers 106, 108, the insulating material 118, and the isolation structures 117 at the source/drain regions are exposed. In various embodiments, the top surface of the isolation structure 117 in the sacrificial gate material 115' is at a first elevation, and the top surface of the isolation structure 117 outside the sacrificial gate material 115' is at a second elevation lower than the first elevation. The isolation structures 117 has a first height D1 measuring from a top surface (in the sacrificial gate material 115') of the isolation structure 117 to a bottom surface of the isolation structure 117. The recessed isolation structure 117 not covered by the sacrificial gate structure 130 or outside the sacrificial gate material 115' has a second height D2 measuring from a top surface 117t to the bottom surface of the exposed/recessed isolation structure 117.

Stated differently, the isolation structure 117 may be considered to include a lower portion 117a and an upper portion 117b extending upwardly from the lower portion 117a. The upper portion 117b is disposed within in the sacrificial gate structure 130 and has the first length L1 (measured along the X-direction). The lower portion 117a may be considered to have a first part disposed within the sacrificial gate structure 130 and a second part extending outwardly from the first part (i.e., the second part is not covered by the sacrificial gate structure 130 nor the sacrificial gate material 115'). The lower portion 117a has a second length L2 greater than the first length L1.

The one or more etch processes may be anisotropic etch processes, such as a reactive ion etching (RIE) process. Process gases may be activated into plasma in a processing chamber, such as transformer coupled plasma (TCP) systems, inductively coupled plasma (ICP) systems, magnetically enhanced reactive ion techniques, electron cyclotron resonance techniques, or the like. The plasma generation power or the bias voltage may be pulsed as a rectangular wave or a square wave, though other pulse shapes may be used. In some embodiments, the plasma generation power and the bias voltage may have synchronized pulses, such that the plasma generation power and the bias voltage are simultaneously in their respective low state or high state. In some embodiments, the plasma is an in-situ plasma. In other embodiments, the plasma is generated in a remote plasma source connected to the processing chamber. Exemplary process gases may include etchant gasses such as $CF_4$, $CHF_3$, $Cl_2$, and $H_2$, passivation gasses such as HBr and/or $O_2$, or a combination thereof. A carrier gas, such as $N_2$, Ar, He, or the like, may be used to carry the process gases into the processing chamber. The etchant gasses may be introduced into the processing chamber at a rate of about 30 sccm to about 50 sccm, and the passivation gases may be introduced into the processing chamber at a rate of about 200 sccm to about 400 sccm. A bias power having a voltage between about 400 volts and about 700 volts, and a plasma source power having a power between about 1000 Watts and about 1500 Watts may be used. In some embodiments, the plasma source power or the bias power may be pulsed with a duty cycle of about 2% to about 8%, and may have a pulse frequency between about 100 Hz and about 200 Hz. The etching process may be performed at a temperature of about 30° C. to about 150° C., and a pressure in a range of about 20 mTorr to about 1 Torr.

Figure 12:
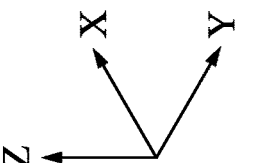

In FIG. 12, gate spacers 138 are formed on exposed surfaces of the sacrificial gate structures 130, the fin structures 112, the isolation structures 117, the second sacrificial gate material 121, the sacrificial gate material 115', and the insulating material 118. The gate spacers 138 may be formed by conformally depositing one or more layers for the gate spacers 138. The gate spacer 138 may be made of a dielectric material, such as $SiO_2$, SiN, SiC, SiON, SiCN, SiOC, SiOCN, AlO, HfO, other dielectric material, and a composite with multi-layers of the above-mentioned material, and/or combinations thereof. In some embodiments, the gate spacer 138 is a silicon nitride-based material. In some embodiments, the gate spacer 138 may include the same material as the isolation structure 117. The gate spacers 138 may have a thickness in a range of about 2 nm to about 10 nm.

Figure 13:
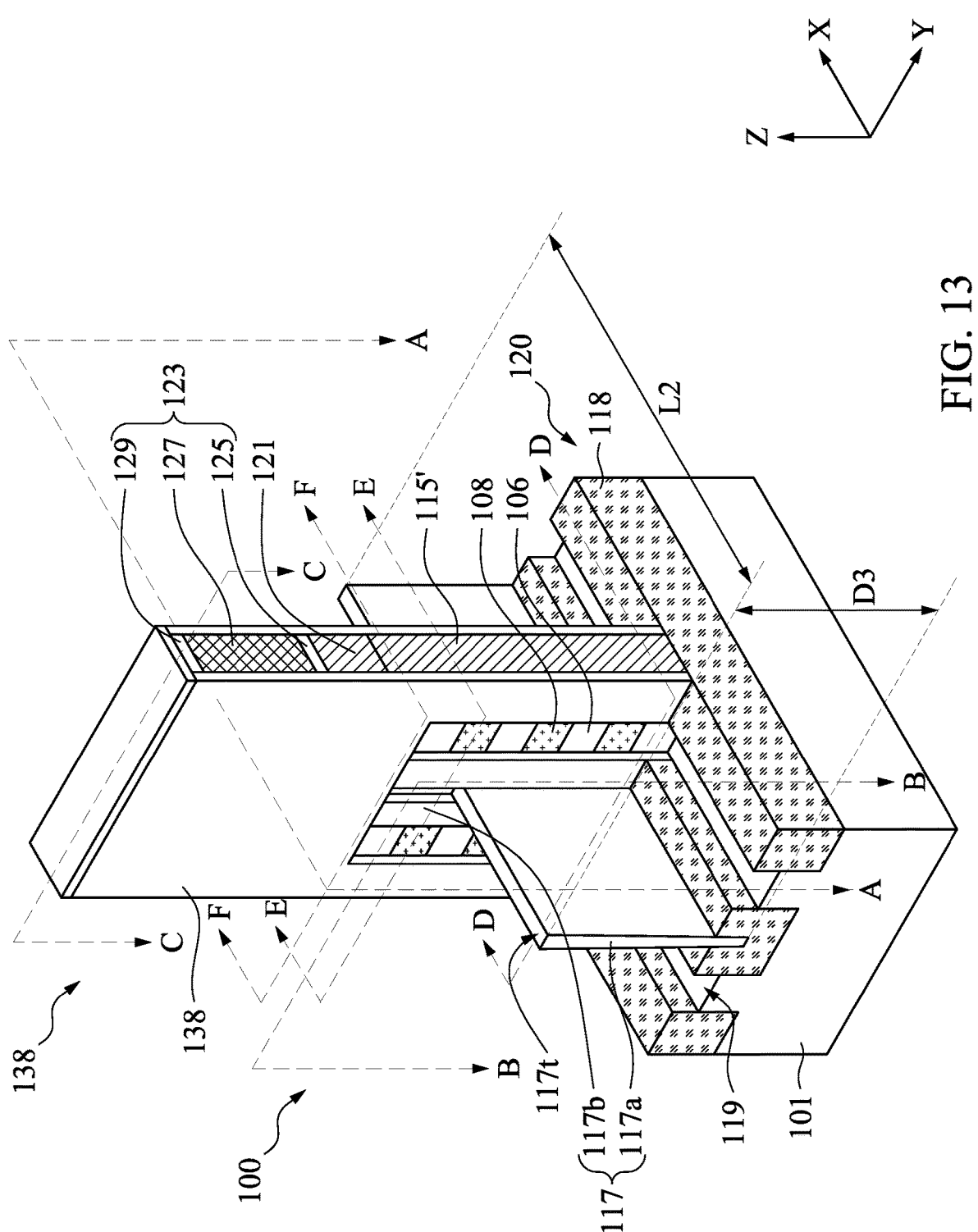
Figure 14B:
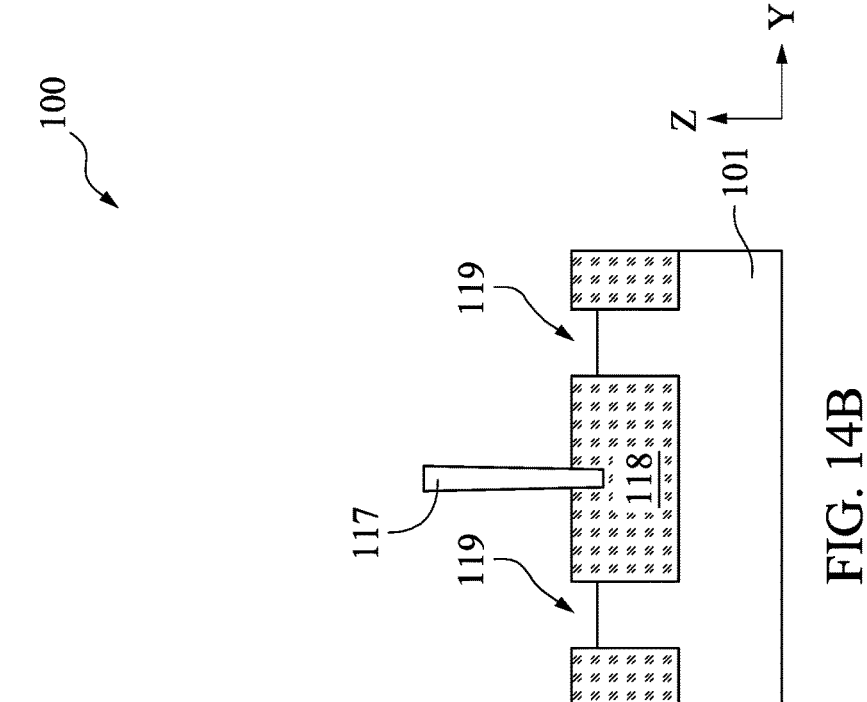
Figure 14A:
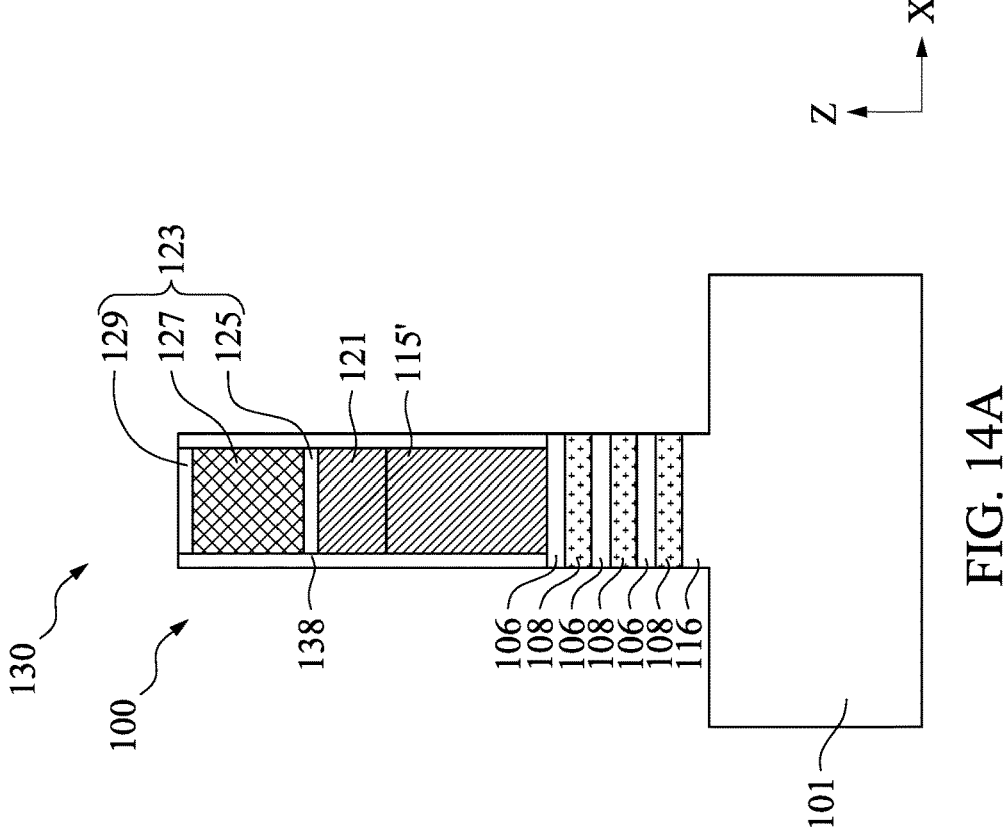
Figure 14C:
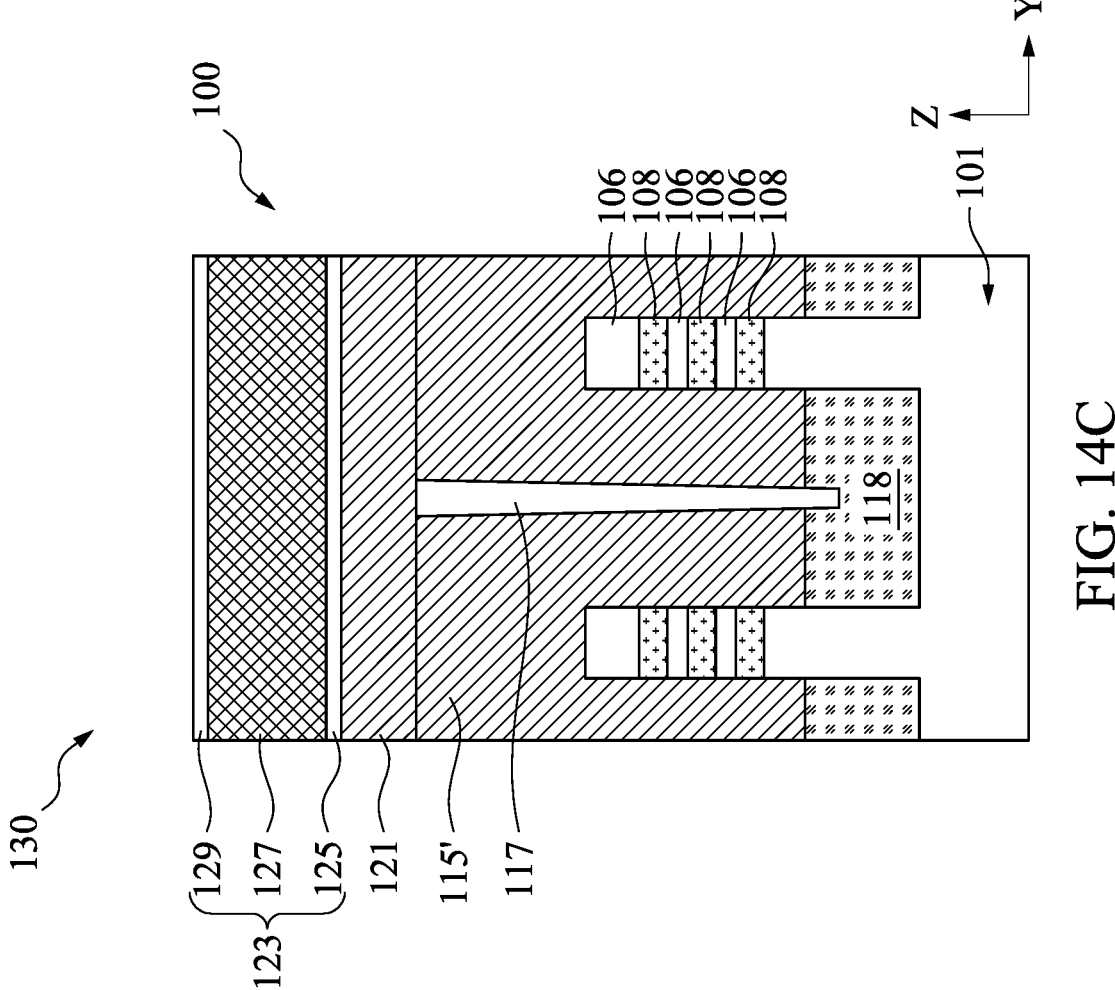

In FIG. 13, an anisotropic etch process is performed to remove portions of the gate spacers 138 formed on horizontal surfaces, and the exposed portions of the fin structures 112 not covered by the sacrificial gate structures 130 and the gate spacers 138 are recessed. The portions of the fin structures 112 that are covered by the sacrificial gate material 115' of the sacrificial gate structure 130 eventually serve as channel regions for the semiconductor device structure 100. After the gate spacers 138 are removed, the portions of the fin structures 112 in the S/D regions (e.g., regions on opposite sides of the sacrificial gate structure 130) are recessed down below the top surface of the isolation region 120 (or the insulating material 118), by removing portions of the fin structures 112 not covered by the sacrificial gate structure 130 and the gate spacers 138. In some embodiments, a small portion of the isolation structures 117 (e.g., about 1 nm to about 5 nm in terms of thickness) not covered by the sacrificial gate structure 130 and the gate spacers 138 may be further recessed, resulting in the exposed/recessed isolation structures 117 with a third height D3 that is shorter than the second height D2 (FIG. 11). The top surface 117t of exposed/recessed isolation structure 117 (i.e., lower portion 117a) may be at an elevation lower than a bottom surface of the topmost first semiconductor layer 106. In some embodiments, top surface 117t of exposed/recessed isolation structure 117 may be at an elevation between the topmost first semiconductor layer 106 and the second first semiconductor layer 106 from the top. In any cases, at least the lower portion 117a and a portion of the upper portion 117b extend through an entire thickness of a portion of the gate spacer 138.

The recess of the portions of the fin structures 112 and the isolation structures 117 can be done by an etch process, either isotropic or anisotropic etch process, and may be selective with respect to the substrate 101. The etch process may be a dry etch, such as a RIE, NBE, or the like, or a wet etch, such as using tetramethyalammonium hydroxide (TMAH), ammonium hydroxide ($NH_4OH$), or any suitable etchant. Trenches 119 are formed in the S/D regions as the result of the recess of the portions of the fin structures 112.

In some cases, some S/D regions may be shared between various transistors. For example, various one of the S/D regions may be connected together and implemented as multiple functional transistors. It should be understood that the source region and the drain region can be interchangeably used since the epitaxial features to be formed in these regions are substantially the same.

FIGS. 14A-22A are cross-sectional side views of various stages of manufacturing the semiconductor device structure 100 taken along line A-A of FIG. 13, in accordance with some embodiments. The line A-A illustrates a cross-section along a fin structure 112. FIGS. 14B-22B are cross-sectional side views of various stages of manufacturing the semiconductor device structure 100 taken along line B-B of FIG. 13, in accordance with some embodiments. The line B-B illustrates a cross-section in the S/D regions. FIGS. 14C-22C are cross-sectional side views of various stages of manufacturing the semiconductor device structure 100 taken along line C-C of FIG. 13, in accordance with some embodiments. The line C-C illustrates a cross-section in a plane perpendicular to cross-section A-A and is in the sacrificial gate structure 130 along the Y-direction.

Figure 15B:
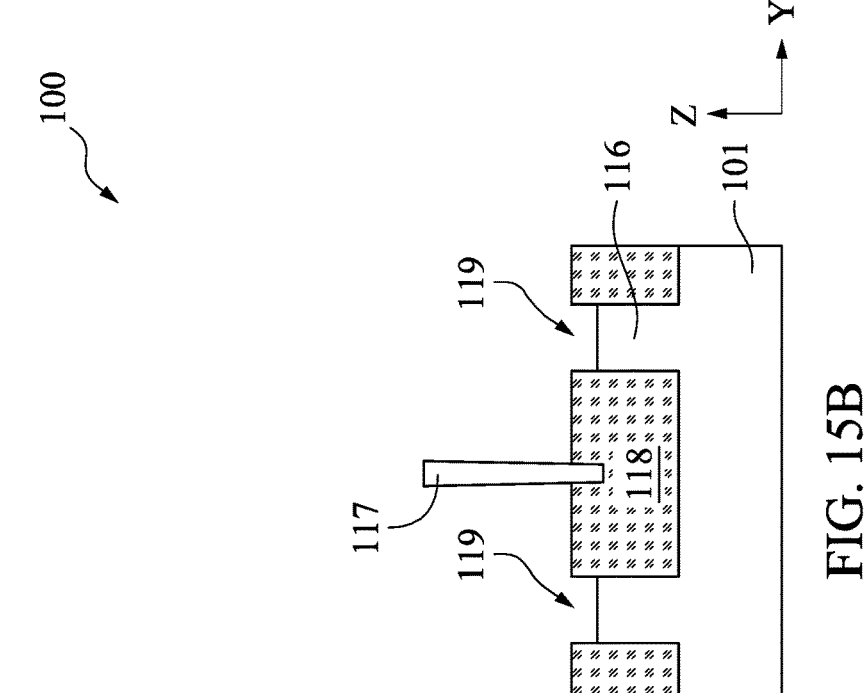
Figure 15A:
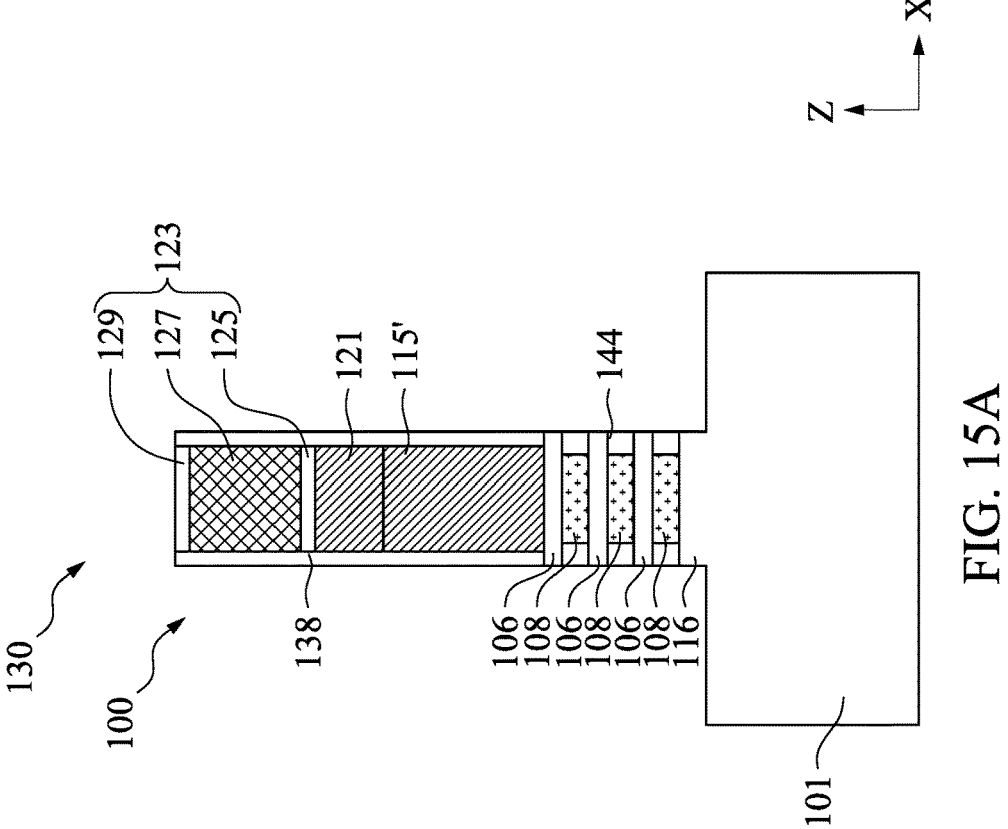
Figure 15C:
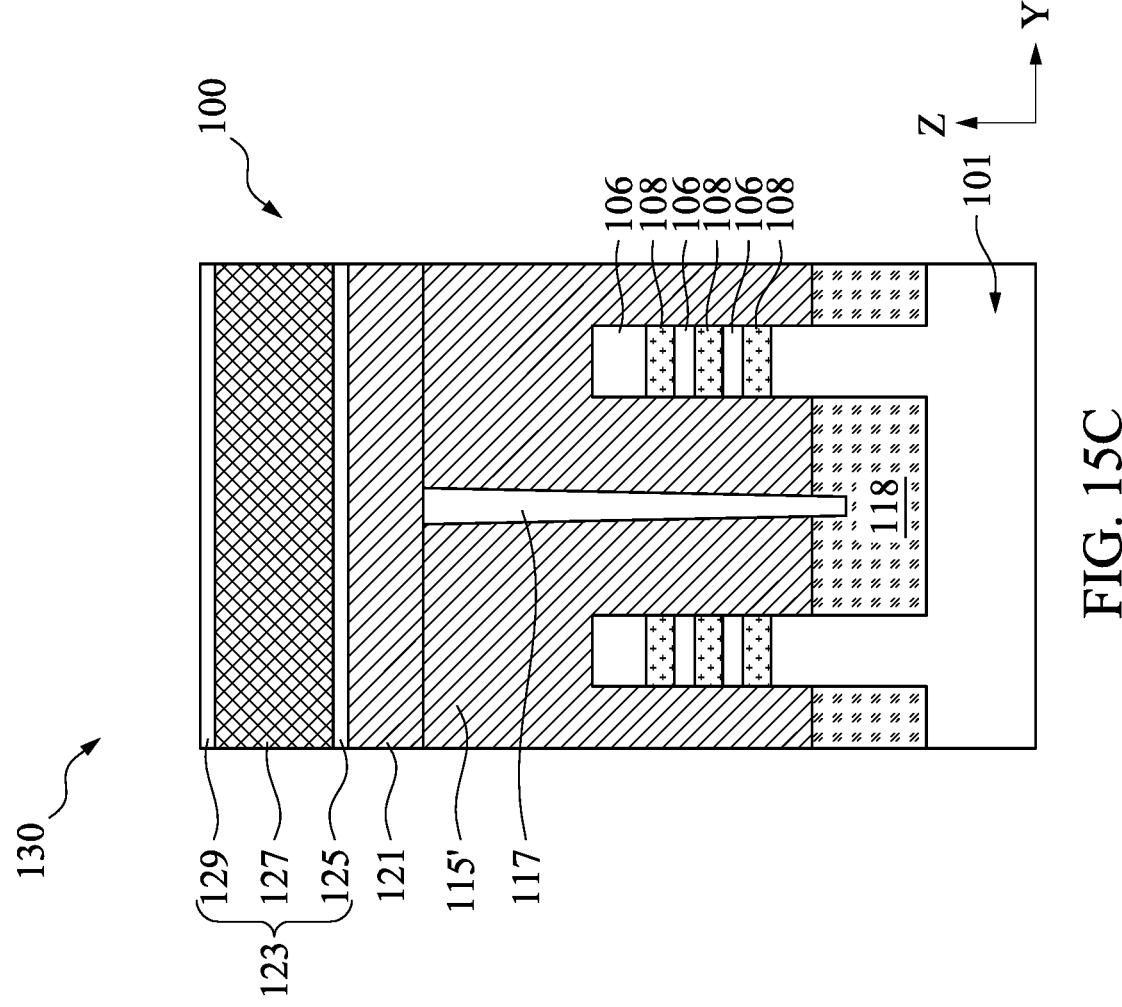

In FIGS. 15A-15C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers (or so-called inner spacer) 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etch process to remove portions of the conformal dielectric layer other than the dielectric spacers 144. The dielectric spacers 144 are protected by the first semiconductor layers 106 during the anisotropic etch process. The remaining second semiconductor layers 108 are capped between the dielectric spacers 144 along the X direction.

Figure 16B:
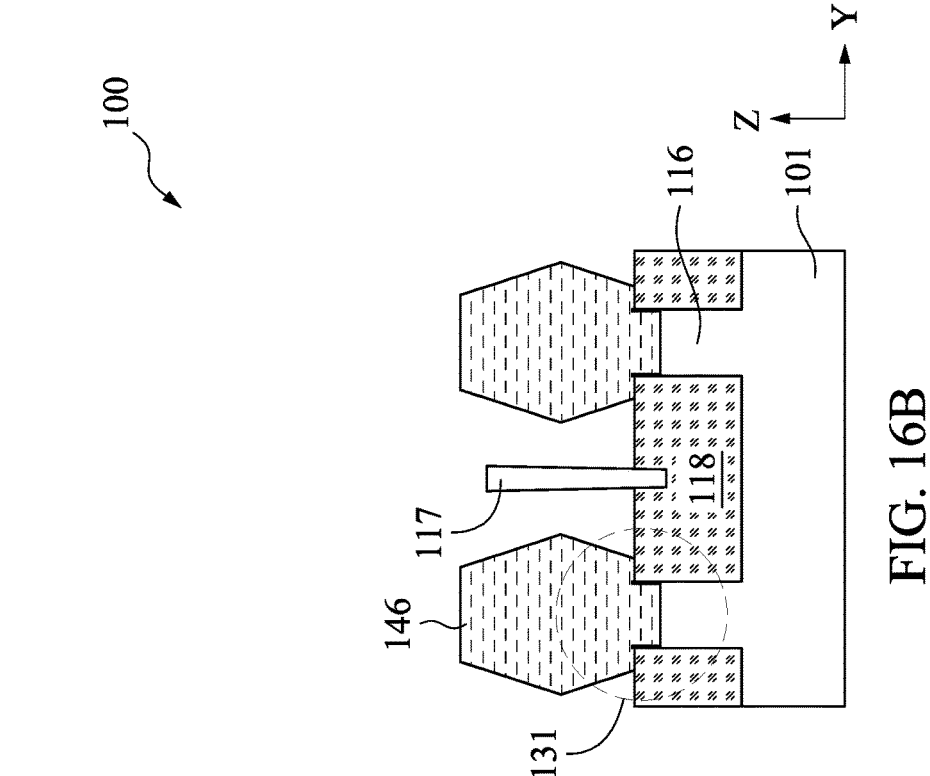
Figure 16A:
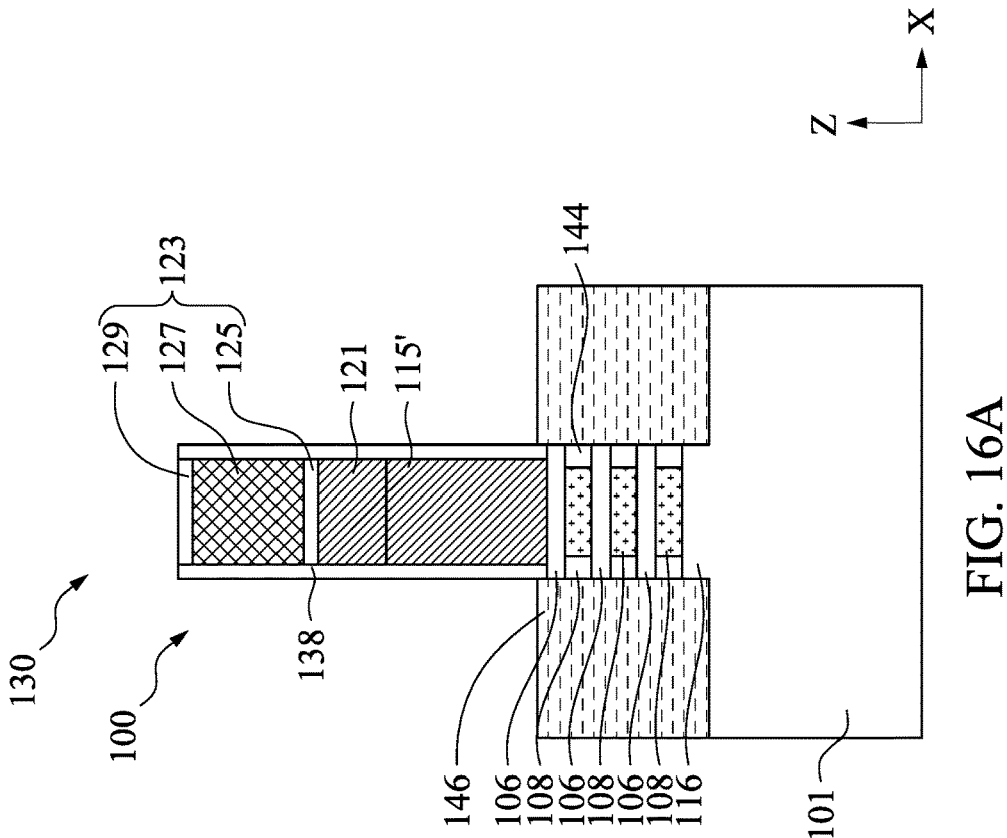
Figure 16C:
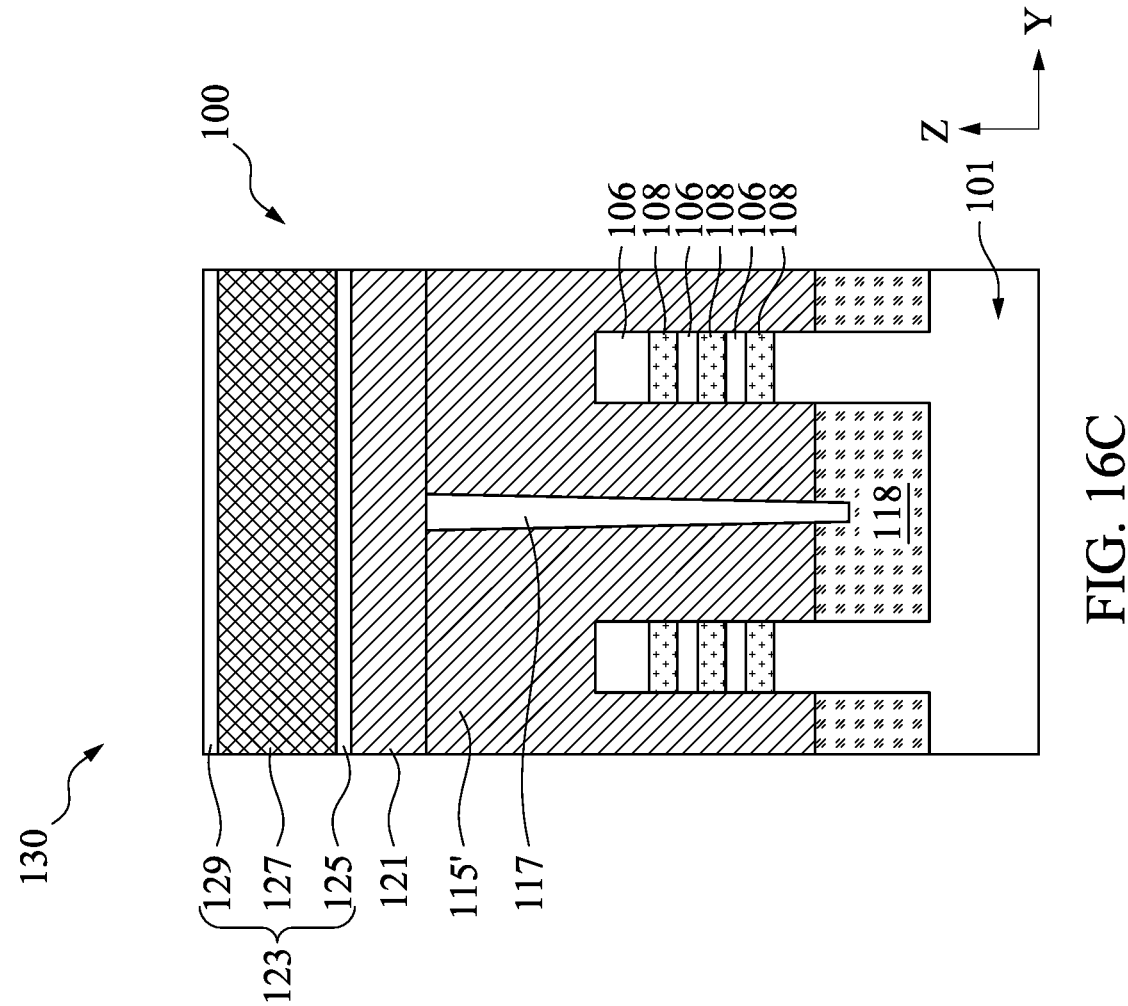
Figures 1, 16B:
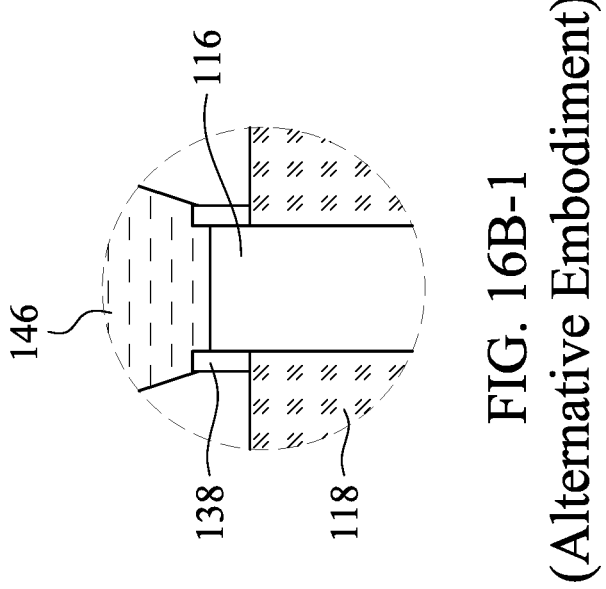

In FIGS. 16A-16C, epitaxial S/D features 146 are formed in the source/drain (S/D) regions. The epitaxial S/D features 146 may be made of one or more layers of Si, SiP, SiC and SiCP for n-channel FETs or Si, SiGe, Ge for p-channel FETs. For p-channel FETs, P-type dopants, such as boron (B), may also be included in the epitaxial S/D features 146. The epitaxial S/D features 146 may be formed by an epitaxial growth method using CVD, ALD or MBE. In one example shown in FIG. 16A, one of a pair of epitaxial S/D features 146 disposed on one side of the sacrificial gate structure 130 is designated as a source feature/terminal, and the other of the pair of epitaxial S/D features 146 disposed on the other side of the sacrificial gate structure 130 is designated as a drain feature/terminal. The source feature/terminal and the drain feature/terminal are connected by the channel layers (e.g., the first semiconductor layers 106). The epitaxial S/D features 146 are in contact with the first semiconductor layer 106 under the sacrificial gate structure 130. In some cases, the epitaxial S/D features 146 may grow pass the topmost semiconductor channel, i.e., the first semiconductor layer 106 under the sacrificial gate structure 130, to be in contact with the gate spacers 138. The second semiconductor layer 108 under the sacrificial gate structure 130 are separated from the epitaxial S/D features 146 by the dielectric spacers 144.

The epitaxial S/D features 146 may grow both vertically and horizontally from the first semiconductor layers 106 and/or the well region 116 of the substrate 101. The epitaxial S/D features 146 may form facets, which correspond to crystalline planes of the material used for the substrate 101 and the first semiconductor layers 106. The isolation structures 117 may prevent the epitaxial S/D features 146 of the neighboring fin structures from merging.

FIG. 16B-1 is an enlarged view showing a region 131 adjacent the recessed fin structures 112 of a portion of the semiconductor device structure 100, in accordance with some embodiments. In this embodiment, a portion of the gate spacers 138 may remain at the S/D regions after the anisotropic etch process, as discussed above with respect to FIG. 13. Particularly, a portion of the epitaxial S/D features 146 are in contact with the well portion 116 and residue of the gate spacers 138 remain on the isolating material 118.

Figure 17B:
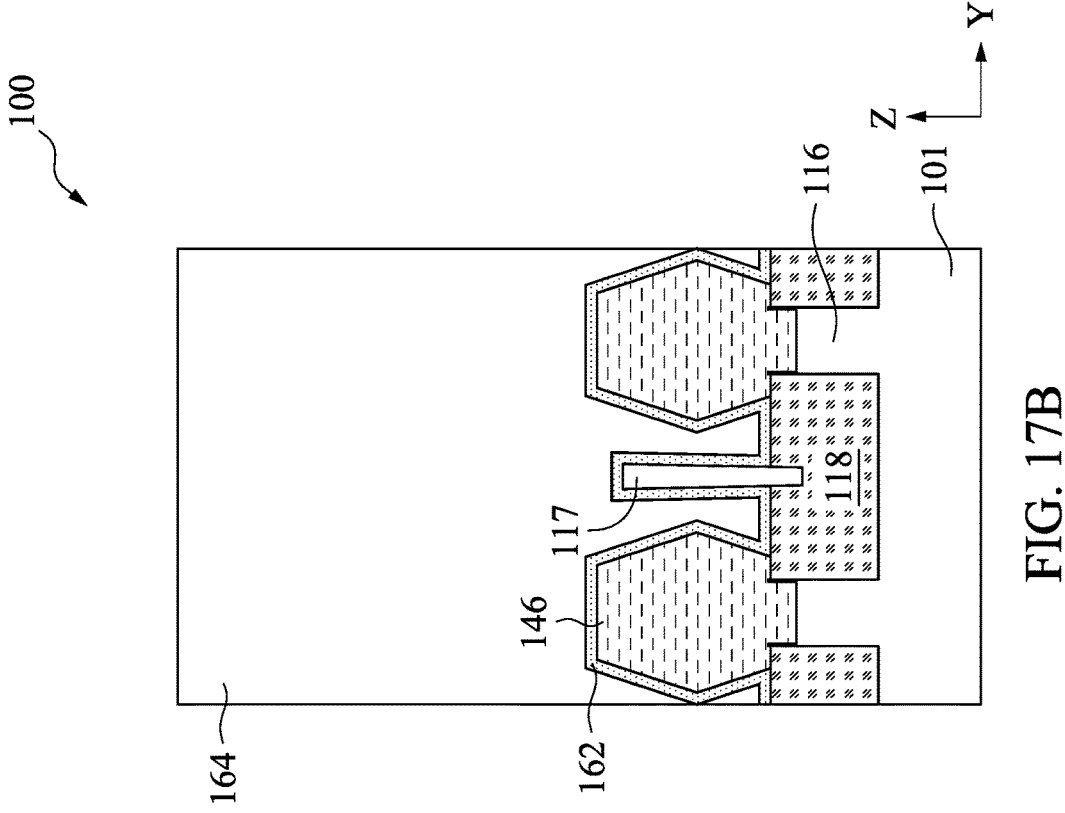
Figure 17A:
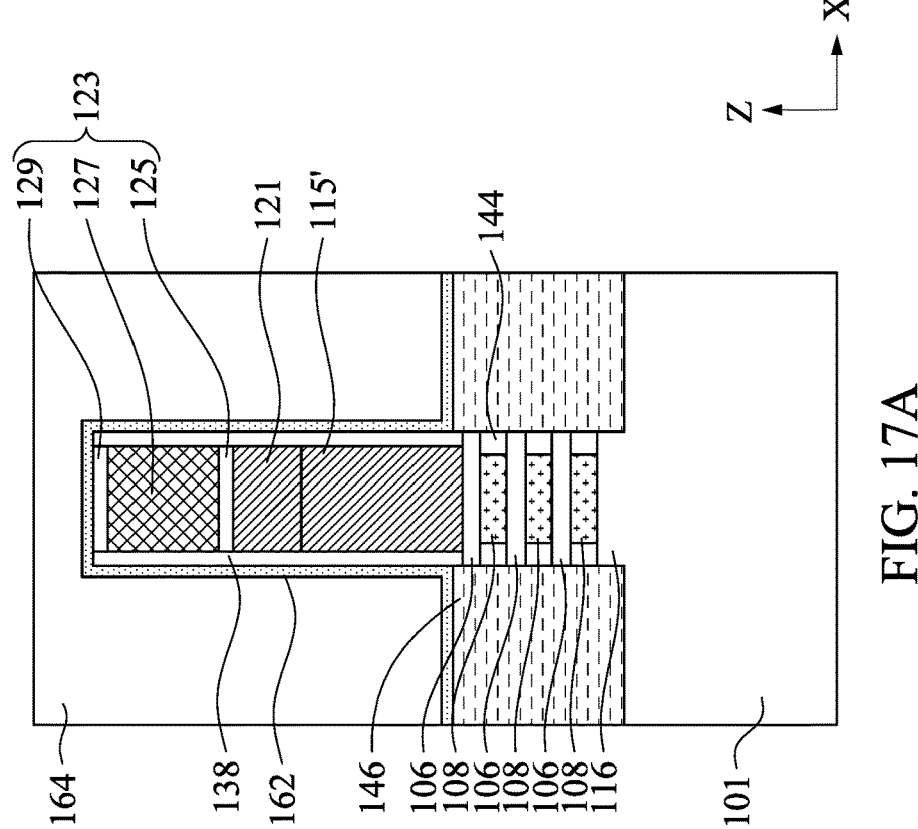
Figure 17C:
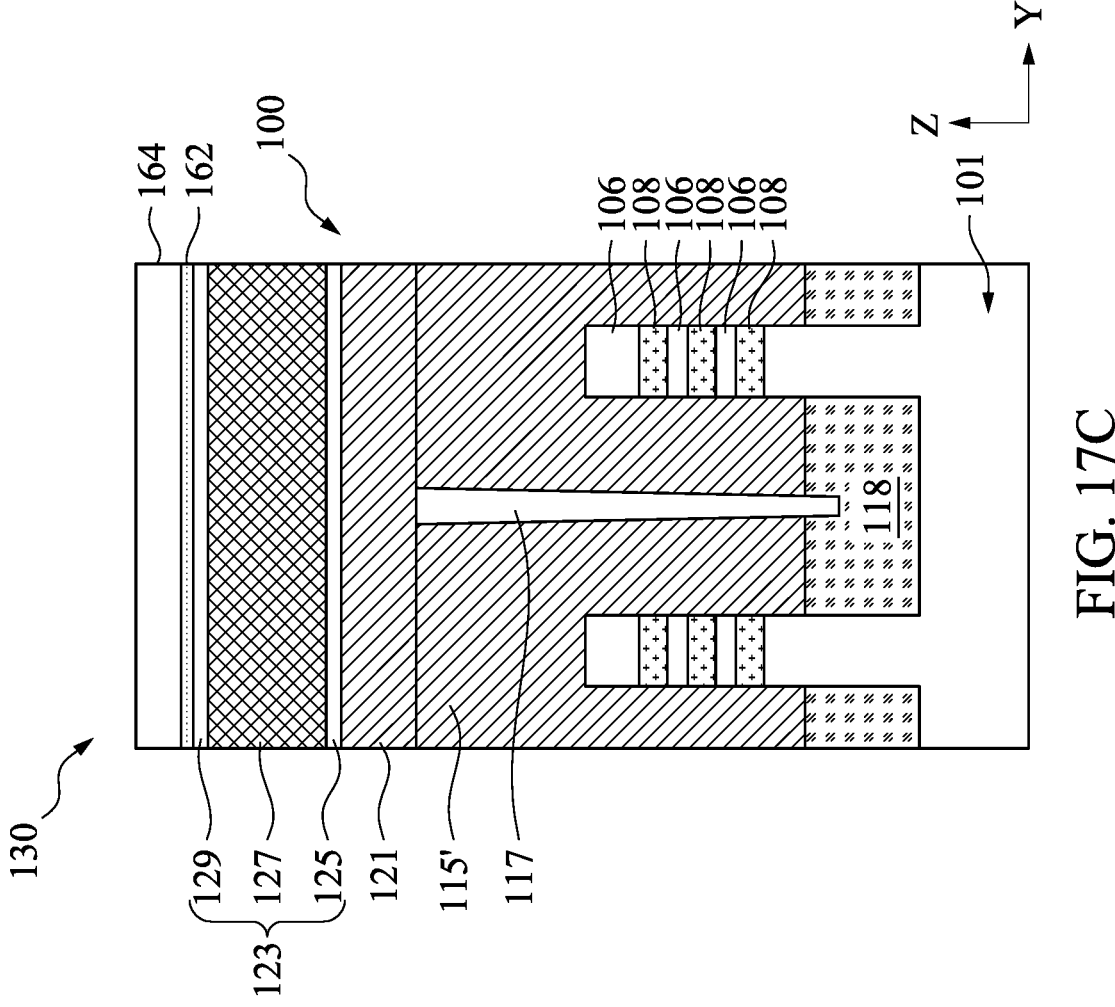

In FIGS. 17A-17C, a contact etch stop layer (CESL) 162 is conformally formed on the exposed surfaces of the semiconductor device structure 100. The CESL 162 covers the exposed surfaces of the sacrificial gate structure 130, the insulating material 118, the epitaxial S/D features 146, the isolation structures 117, and the exposed surfaces of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the first ILD layer 164 may include compounds comprising Si, O, C, and/or H, such as silicon oxide, TEOS oxide, SiCOH and SiOC. Organic materials, such as polymers, may also be used for the first ILD layer 164. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figure 18B:
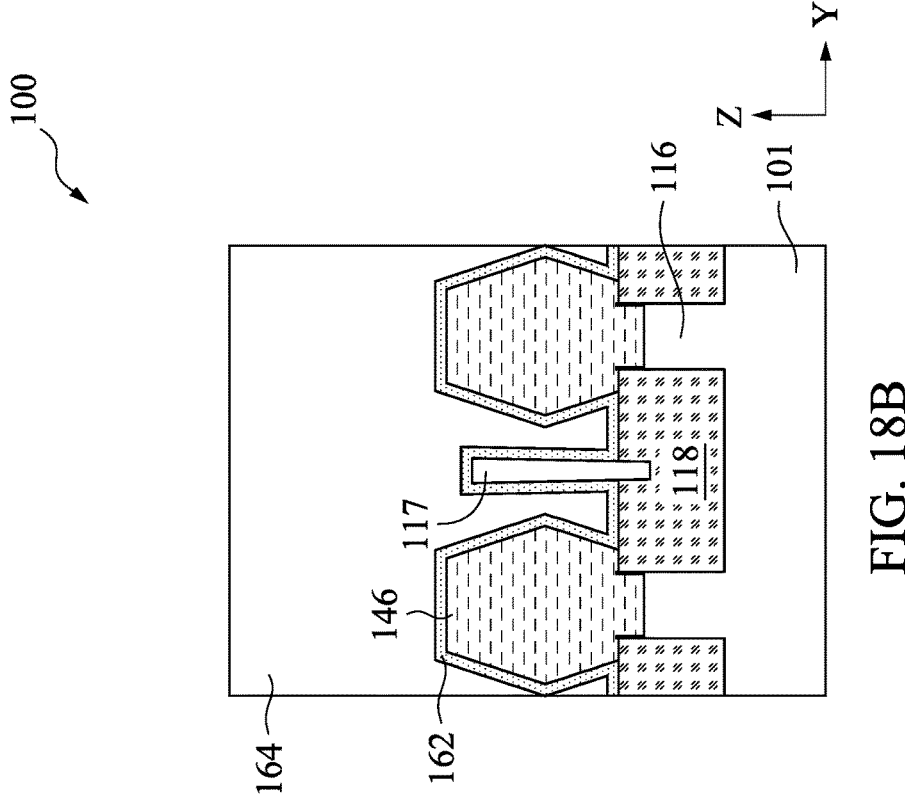
Figure 18A:
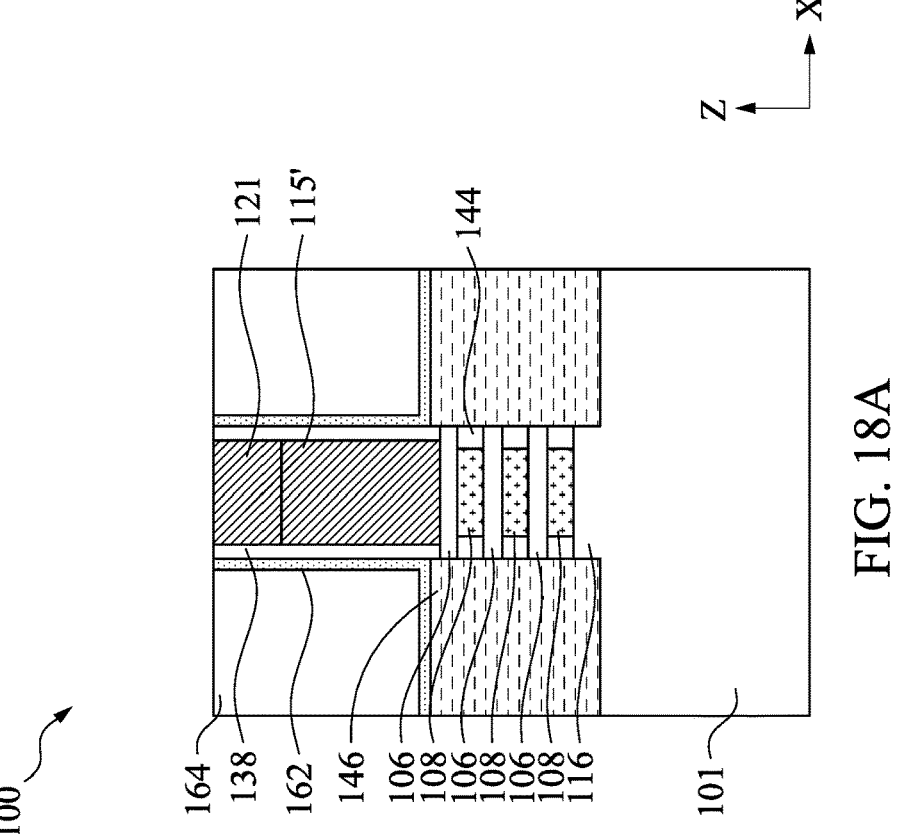
Figure 18C:
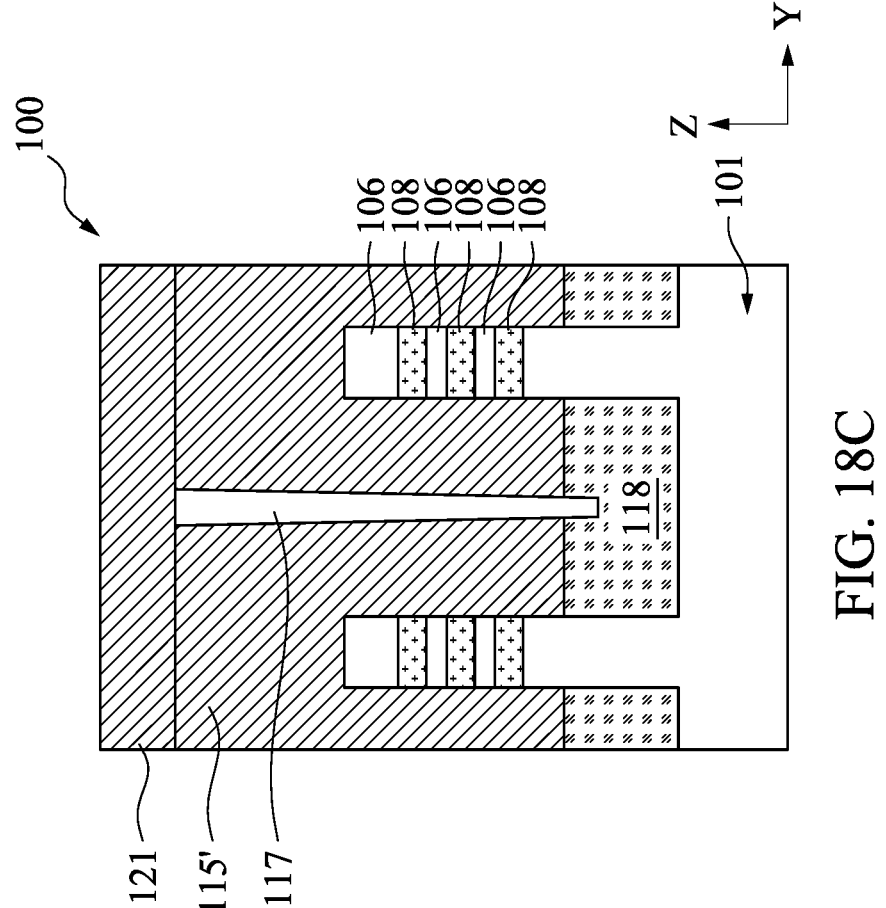

In FIGS. 18A-18C, after the first ILD layer 164 is formed, a planarization operation, such as CMP, is performed on the semiconductor device structure 100 until the second sacrificial gate material 121 (or the sacrificial gate material 115' if the second sacrificial gate material 121 is not used) is exposed.

Figures 19A, 19B:
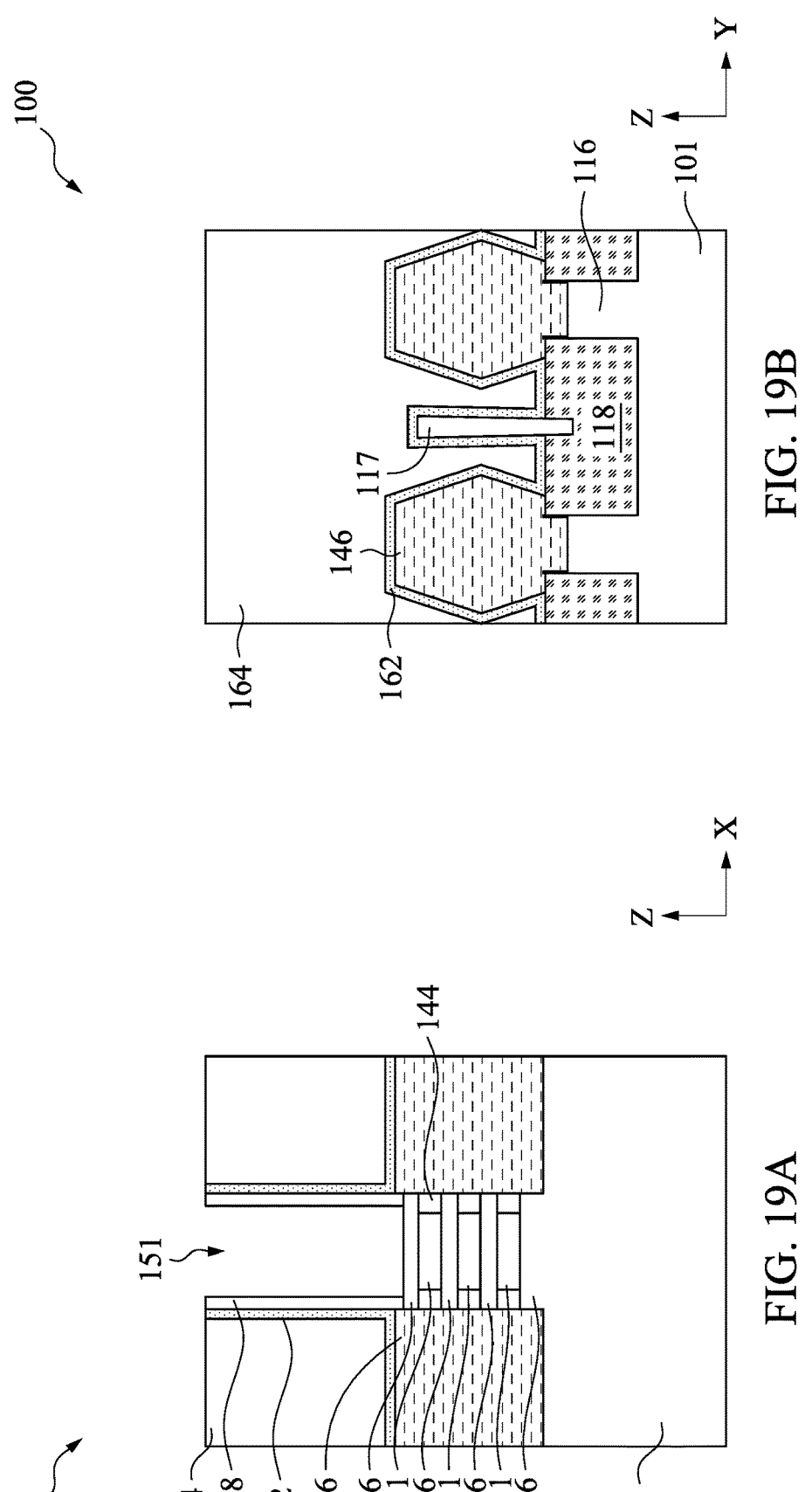
Figure 19C:
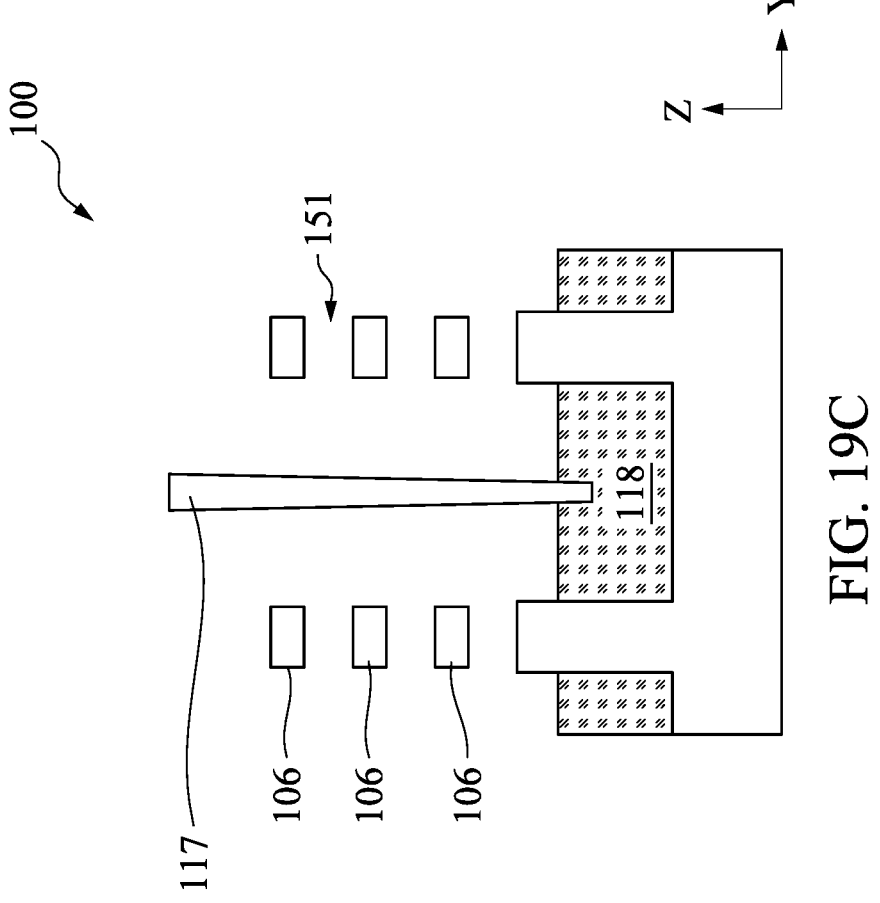

In FIGS. 19A-19C, the sacrificial gate structure 130 and second semiconductor layers 108 are removed. The first ILD layer 164 protects the epitaxial S/D features 146 and the isolation structures 117 during the removal of the sacrificial gate structure 130. The sacrificial gate structure 130 can be removed using plasma dry etching and/or wet etching. For example, in cases where the second sacrificial gate material 121 and the sacrificial gate material 115' are polysilicon and the first ILD layer 164 is silicon oxide, a wet etchant such as a tetramethylammonium hydroxide (TMAH) solution can be used to selectively remove the second sacrificial gate material 121 and the sacrificial gate material 115' without removing the dielectric materials of the first ILD layer 164, the CESL 162, the isolation structures 117, and the gate spacers 138. The sacrificial gate dielectric layer (if used) is then removed using plasma dry etching and/or wet etching. The removal of the sacrificial gate structure 130 forms an opening 151 in the regions where the second sacrificial gate material 121, and the sacrificial gate material 115' were removed. The trench 151 exposes the top and sides of the exposed stack of semiconductor layers 104 (e.g., the first semiconductor layers 106 and the second semiconductor layers 108) and the isolation structures 117.

Then, the exposed second semiconductor layers 108 are removed. The removal of the second semiconductor layers 108 exposes the dielectric spacers 144, and the first semiconductor layers 106. In some embodiments, a small amount of the first semiconductor layer 106 may be removed during the removal of the second semiconductor layers 108. The removal process may be any suitable etch processes, such as dry etch, wet etch, or a combination thereof. The etch process may be a selective etch process that removes the second semiconductor layers 108 but not the isolation structures 117, the gate spacers 138, the CESL 162, the first ILD layer 164, and the first semiconductor layers 106. As a result, openings 151 are formed around the first semiconductor layers 106, and the portion of the first semiconductor layers 106 not covered by the dielectric spacers 144 is exposed to the openings 151.

Figure 20B:
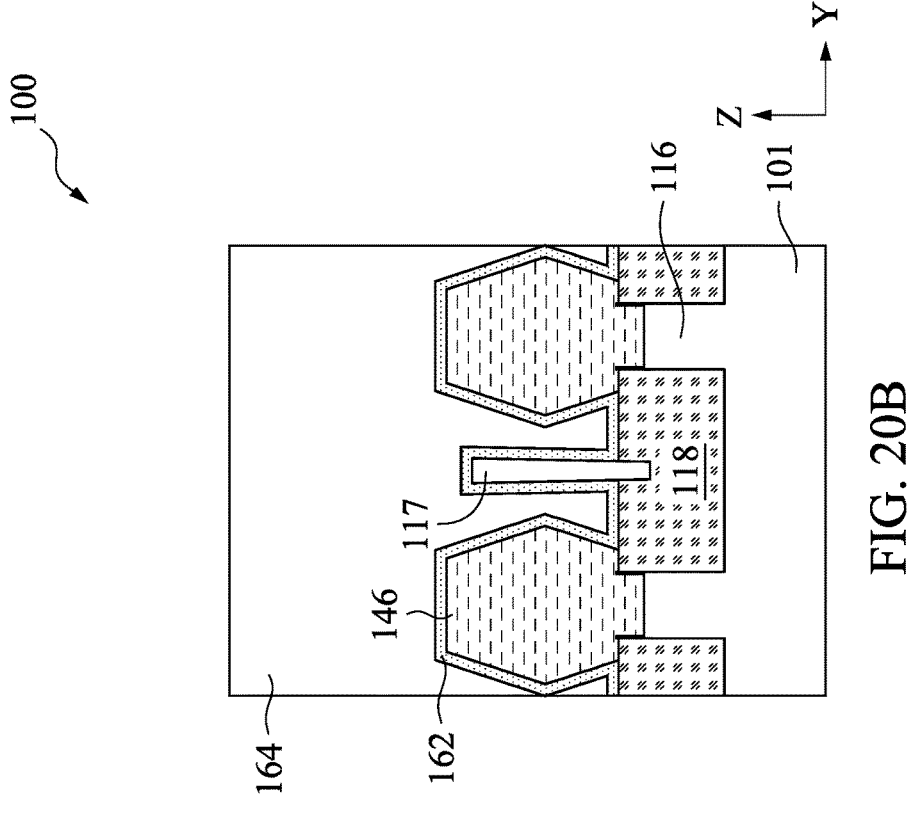
Figure 20A:
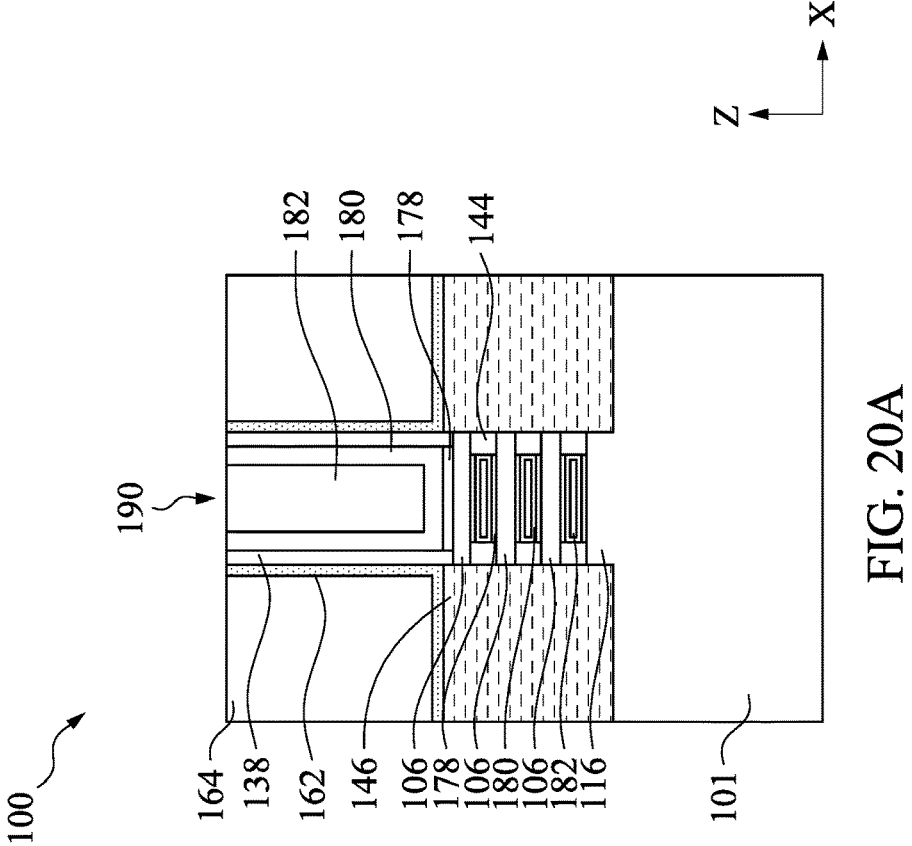
Figure 20C:
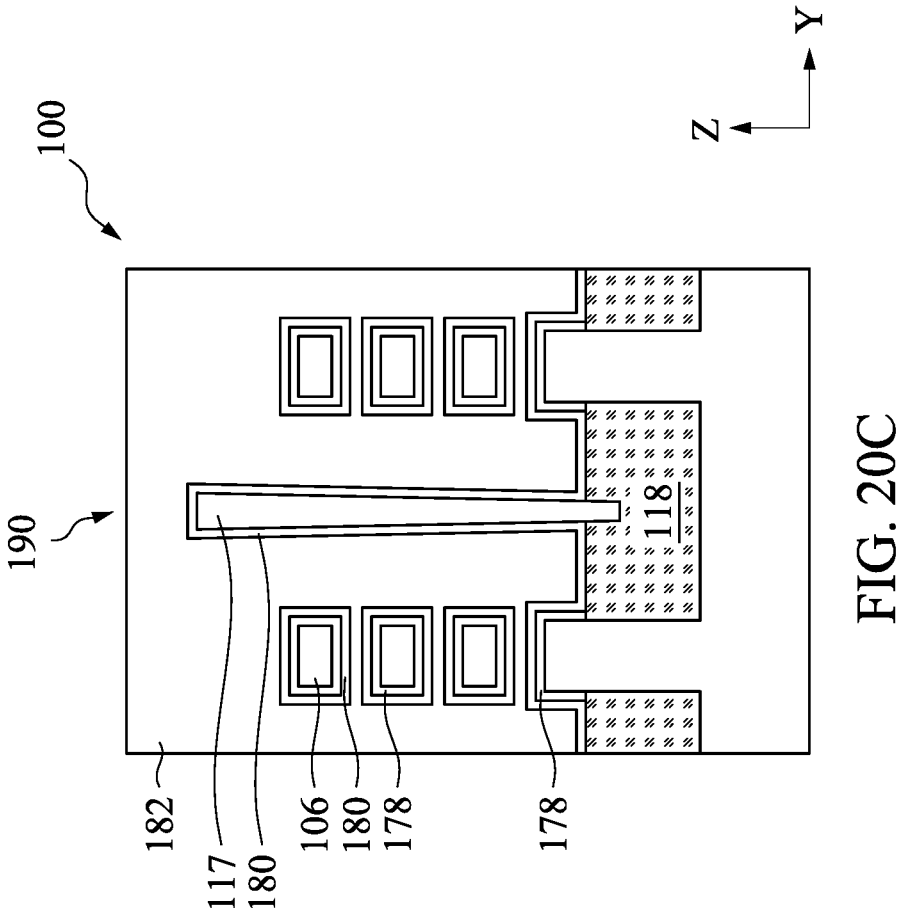

In FIGS. 20A-20C, replacement gate structures 190 are formed. The replacement gate structures 190 each includes an interfacial layer (IL) 178, a gate dielectric layer 180, and a gate electrode layer 182. The interfacial layer (IL) 178 is formed to surround exposed surfaces of the first semiconductor layers 106. In some embodiments, the IL 178 may also form on the well portion 116 of the substrate 101. The IL 178 may include or be made of an oxygen-containing material or a silicon-containing material, such as silicon oxide, silicon oxynitride, oxynitride, hafnium silicate, etc. In one embodiment, the IL 178 is silicon oxide. The IL 178 may be formed by CVD, ALD, a clean process, or any suitable process. Next, the gate dielectric layer 180 is formed on the exposed surfaces of the semiconductor device structure 100. In some embodiments, the gate dielectric layer 180 is formed to wrap around and in contact with the IL 178. The gate dielectric layer 180 also forms on and in contact with isolation structures 117. The gate dielectric layer 180 may include or made of a high-K dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-K materials. The gate dielectric layer 180 may be a conformal layer formed by a conformal process, such as an ALD process or a CVD process.

After formation of the IL 178 and the gate dielectric layer 180, the gate electrode layer 182 is formed on the gate dielectric layer 180. The gate electrode layer 182 fills the openings 151 (FIGS. 19A and 19C) and surrounds a portion of each of the first semiconductor layers 106. The gate electrode layer 182 also covers at least three sides of the isolation structures 117. In some embodiments, the gate electrode layer 182 may be formed using multiple layers, each layer deposited sequentially adjacent to each other using a highly conformal deposition process such as ALD. Other deposition technique such as PVD, CVD, or electroplating may also be used. While not shown, the gate electrode layer 182 may include a capping layer, a barrier layer, an n-metal work function layer, a p-metal work function layer, and a fill material. The capping layer and the barrier layer may be metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be formed of a material different from the capping layer. The n-metal work function layer may be formed from a metallic material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable n-type work function materials, or combinations thereof. The p-metal work function layer may be formed from a metallic material such as W, Al, Cu, TiN, Ti, TiAlN, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Once the n-metal work function layer and the p-metal work function layer are formed, the fill material is deposited to fill a remainder of the opening 151. The fill material may be a material such as W, Al, Cu, AlCu, W, Ti, TiAlN, TaC, TaCN, TaSiN, Mn, Zr, TiN, Ta, TaN, Co, Ni, combinations of these, or the like.

Figure 21B:
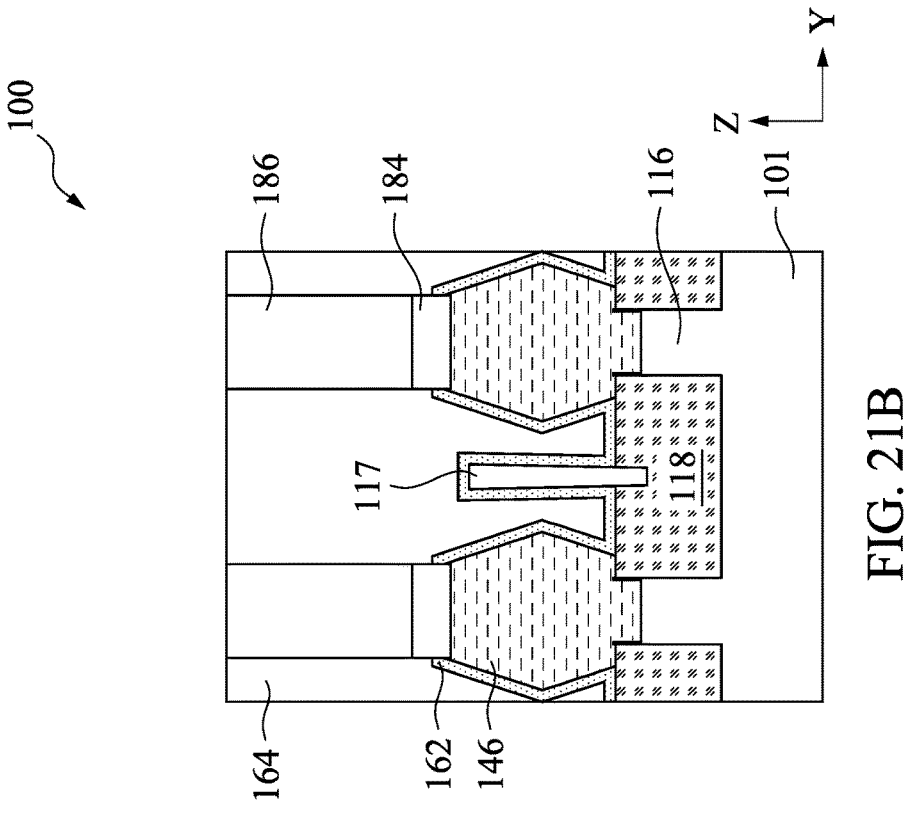
Figure 21A:
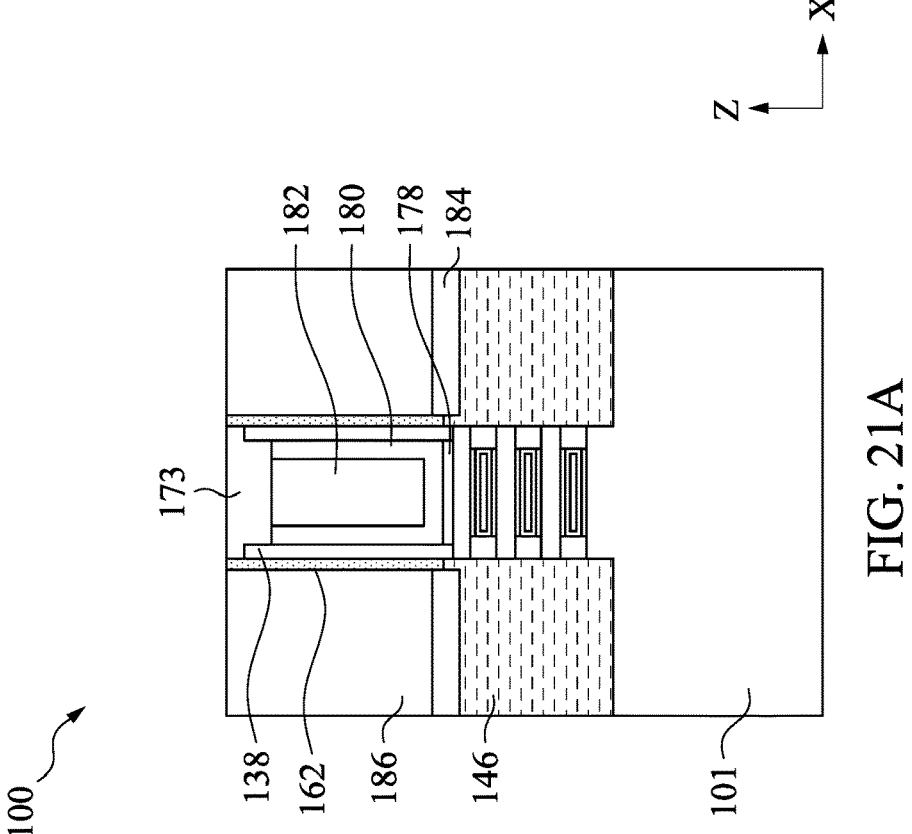
Figure 21C:
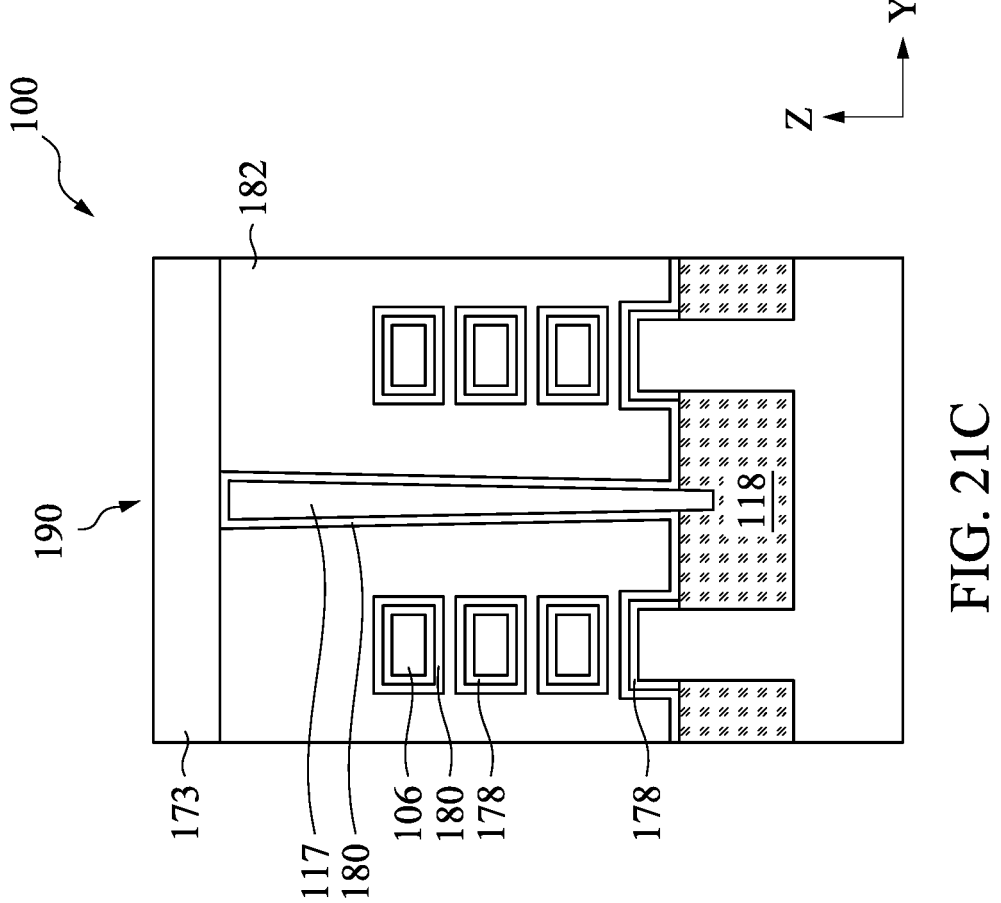

In FIGS. 21A-21C, the gate electrode layer 182 may be subject to one or more metal gate etching back (MGEB) processes. The MGEB processes are performed so that the top surfaces of the gate electrode layer 182 and the gate dielectric layer 180 are recessed to a level below the top surface of the gate spacers 138. In some embodiments, the gate spacers 138 are also recessed to a level below the top surface of the ILD layer 164, as shown in FIG. 21A. A self-aligned contact (SAC) layer 173 is then formed over the gate electrode layer 182 and the gate dielectric layer 180 between the gate spacers 138. A portion of the bottom of the SAC layer 173 is in contact with the gate dielectric layer 180 over the isolation structure 117. Therefore, the SAC layer 173 does not interfere with the isolation structure 117. The SAC layer 173 may be a dielectric material having an etch selectivity relative to the ILD layer 164. In some embodiments, the SAC layer 173 includes silicon nitride. A gate contact (not shown) may be subsequently formed in the SAC layer 173 and in contact with the gate electrode layer 182.

After formation of the SAC layer 173, contact openings are formed through the ILD layer 164 and the CESL 162 to expose the epitaxial S/D feature 146. A silicide layer 184 is then formed on the S/D epitaxial features 146, and a S/D contact 186 is formed in the contact opening on the silicide layer 184. The S/D contact 186 may include an electrically conductive material, such as Ru, Mo, Co, Ni, W, Ti, Ta, Cu, Al, TiN, or TaN.

Figure 21E:
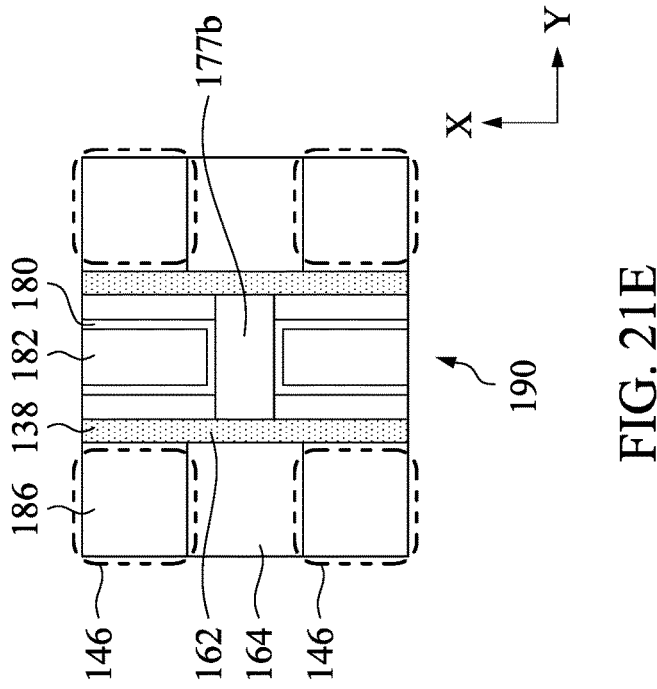
FIGS. 21D-21F are top views of the semiconductor device structure taken along line D-D, line E-E, and line F-F of FIG. 13 at different heights, in accordance with some embodiments.
Figure 21D:
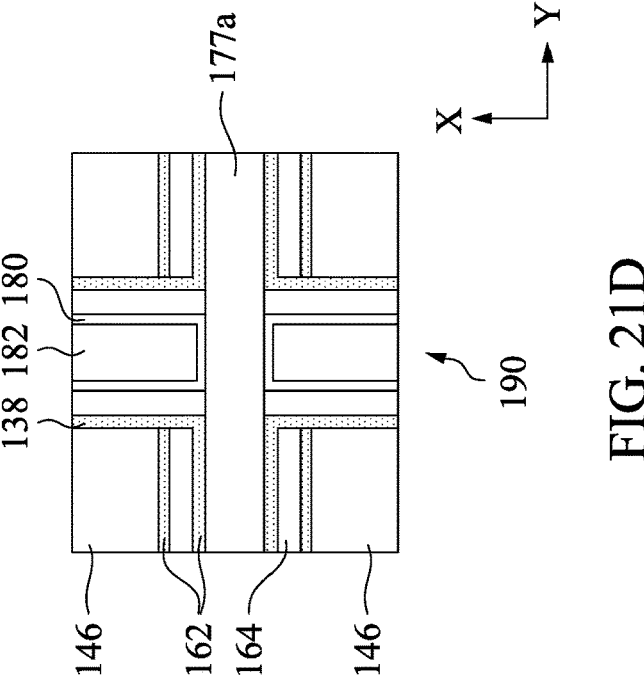
Figure 21F:
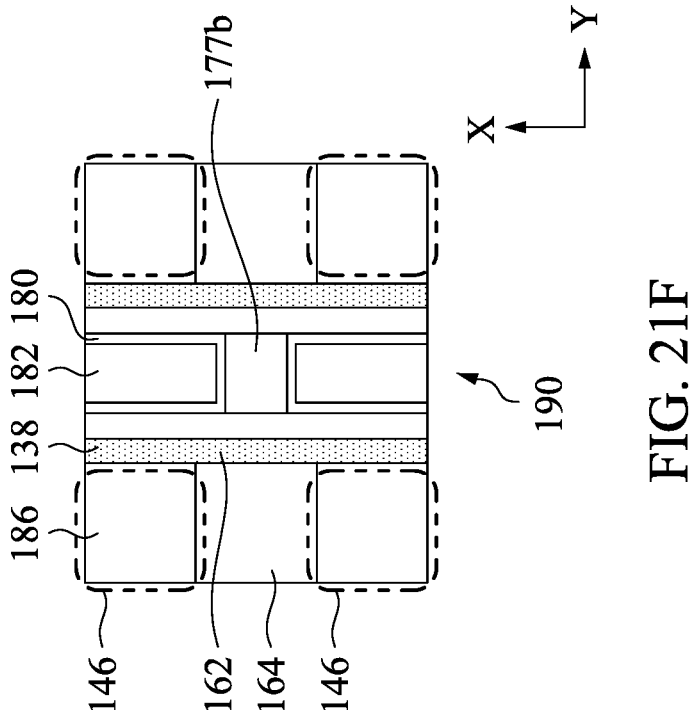

FIGS. 21D-21F are top views of the semiconductor device structure 100 taken along line D-D, line E-E, and line F-F of FIG. 13 at different heights, in accordance with some embodiments. FIGS. 21D-21F illustrate a stage after the replacement gate 190 is formed. The line D-D illustrates a cross-section of the isolation structure 117 (e.g., the isolation structure 117a) at an elevation of the epitaxial S/D feature 146, the line E-E illustrates a cross-section of the isolation structure 117 (e.g., the isolation structure 117b) at an elevation slightly above the top surface 117t of the isolation structure 117, and the line F-F illustrates a cross-section of the isolation structure 117 at an elevation of the S/D contacts 186 (higher than the line E-E). As can be seen in all FIGS. 21D-21F, the replacement gate structure 190 extends along the X-direction, and the isolation structure 117 extends from the S/D regions and into the replacement gate structure 190 along the Y-direction. Due to the height difference of the isolation structure 117 at regions between the replacement gate structure 190 (e.g., first height D1 in FIG. 11) and at the S/D regions (e.g., third height D3 in FIG. 13), the isolation structures 117 at the S/D regions can extend through and separate the lower gate spacer disposed at an elevation of the epitaxial S/D features 146 or the channel regions (i.e., first semiconductor layers 106), as shown in FIGS. 21D and 21E. In other words, the gate spacer 138 at this elevation is discontinuous along the Y-direction when viewed from the top of the gate spacer 138. In FIG. 21D, a first side and a second side (opposite the first side) of the isolation structure 117 at the elevation of the epitaxial S/D feature 146 are in contact with the gate dielectric layer 180, the gate spacers 138, and the CESL 162.

In FIG. 21E, a first side and a second side (opposite the first side) of the isolation structure 117 at the elevation slightly above the top surface 117t of the isolation structure 117 are in contact with the gate dielectric layer 180 and the gate spacers 138, and a third side and a fourth side (opposite the third side) of the isolation structure 117 at the elevation slightly above the top surface 117t of the isolation structure 117 are entirely in contact with the CESL 162. In some embodiments, a portion of the lower gate spacers 138 has a first side in contact with the CESL 162, a second side in contact with the isolation structure 117b, and a third side in contact with the gate dielectric layer 180.

In FIG. 21F, a first side and a second side (opposite the first side) of the isolation structure 117 at the elevation of the S/D contacts 186 are entirely in contact with the gate dielectric layer 180, and a third side and a fourth side (opposite the third side) of the isolation structure 117 at the elevation of the S/D contacts 186 are entirely in contact with the gate spacer 138. The isolation structure 117 in the replacement gate structure 190 does not extend to separate the upper gate spacers 138. In other words, the gate spacers 138 are continuous along the Y-direction when viewed from the top of the gate spacer 138.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 146 to a backside power rail (e.g., positive voltage VDD or negative voltage VSS) through the backside contacts. Depending on the application, the source or drain feature/terminal of the epitaxial S/D features 146 and the gate electrode layer 182 may be connected to a frontside power source.

Embodiments of the present disclosure provide a semiconductor device structure including one or more isolation structures arranged in a direction perpendicular to a longitudinal direction of replacement gate structures in selected regions. The isolation structure extends from between adjacent fin structures at S/D regions to a region across the replacement gate structure. The isolation structures are formed in a sacrificial gate material before the sacrificial gate material is defined to form sacrificial gate structures. Forming the isolation structures prior to formation of the replacement gate structure is advantageous because the sacrificial gate material has not been exposed to various thermal processes (e.g., thermal treatments performed during and/or after formation of epitaxial S/D features or interlayer dielectric (ILD), etc.). Therefore, the sacrificial gate material can remain in an amorphous state with little or no crystallization, which would otherwise degrade subsequent etching profiles of the completed structure(s) due to increased grain boundaries introduced from crystallization of the sacrificial gate material. When compared to traditional cut-poly processes where the isolation structure is formed after the replacement gate structure is formed or after the sacrificial gate structure is defined but prior to formation of the replacement gate structure, the gate height demand with the inventive concept is minimum or not required because the isolation structures are formed before the sacrificial gate structure is defined. Therefore, the critical dimension (CD) of the isolation structures can be independent from the gate length. Also, there is no need to preserve additional gate height for gate isolation as would otherwise needed by the traditional cut-poly processes when removing the excessive isolation material from the top surface of the replacement gate structure or the sacrificial gate structure. Lastly, the inventive isolation structures can be integrated with self-aligned contact (SAC) layer process as the isolation structures are disposed below the SAC layer and do not interfere with the SAC layer.

An embodiment is a semiconductor device structure. The structure includes a plurality of semiconductor layers vertically stacked over a substrate, a source/drain feature in contact with each of the plurality of the semiconductor layers, a gate electrode layer surrounding a portion of each of the plurality of the semiconductor layers, a source/drain contact disposed above the source/drain feature, a gate spacer disposed between the gate electrode layer and the source/drain contact, and an isolation structure extending through the gate electrode layer. The isolation structure includes a first portion having three sides covered by the gate electrode layer, the first portion having a top surface at a first elevation, and a second portion extended outwardly from the first portion, the second portion having a top surface at a second elevation that is lower than the first elevation.

Another embodiment is a semiconductor device structure. The structure includes a semiconductor layer disposed over a substrate, a gate electrode layer disposed to surround the semiconductor layer, the gate electrode layer extending along a first direction. The structure also includes a gate dielectric layer disposed between the isolation structure and the gate electrode layer, a first source/drain feature disposed over the substrate, a gate spacer disposed between the gate electrode layer and the first source/drain feature, and an isolation structure extending along a second direction perpendicular to the first direction. The isolation structure has a first side, a second side opposite the first side, a third side connecting the first side to the second side, and a fourth side connecting the first side to the second side. The isolation structure includes an upper portion, wherein the entire first and second sides of the upper portion are in contact with the gate dielectric layer, and a lower portion, wherein the first and second sides of the lower portion are in contact with the gate dielectric layer and the gate spacer.

A further embodiment is a method for forming a semiconductor device structure. The method includes depositing a stack of semiconductor layers over a substrate, the stack of the semiconductor layers comprising a plurality of first semiconductor layers and a plurality of second semiconductor layers alternatingly stacked, forming a first fin structure and a second fin structure from the stack of semiconductor layers, forming a shallow trench isolation (STI) around the first and second fin structure, depositing a first sacrificial gate material over the STI, forming an isolation structure in the first sacrificial gate material between the first and second fin structures, patterning the first sacrificial gate material to form a sacrificial gate structure over a portion of isolation structure and the first and second fin structures, forming a gate spacer on exposed surfaces of the sacrificial gate structure, the isolation structure, and the first and second fin structures, performing an etch process to remove the gate spacer from horizontal surfaces of the sacrificial gate structure, the isolation structure, and the first and second fin structures, removing portions of the first and second fin structures not covered by the sacrificial gate structure to expose a portion of the substrate, forming a source/drain feature on opposite sides of the sacrificial gate structure, forming sequentially a contact etch stop layer (CESL) and an interlayer dielectric (ILD) layer over the source/drain features and the isolation structure, removing the sacrificial gate structure and the plurality of second semiconductor layers to expose portions of the plurality of first semiconductor layers and the isolation structure, and forming a gate electrode layer over the exposed portions of the plurality of first semiconductor layers and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A semiconductor device structure, comprising:
a plurality of semiconductor layers vertically stacked over a substrate;
a source/drain feature in contact with each of the plurality of the semiconductor layers;
a gate electrode layer surrounding a portion of each of the plurality of the semiconductor layers;
a source/drain contact disposed above the source/drain feature;
a gate spacer disposed between the gate electrode layer and the source/drain contact; and an isolation structure extending through the gate electrode layer, the isolation structure comprising:

a first portion having three sides covered by the gate electrode layer, the first portion having a top surface at a first elevation; and a second portion extended outwardly from the first portion, the second portion having a top surface at a second elevation that is lower than the first elevation, wherein the first portion and the second portion are integrally formed from a continuous material.

2. The semiconductor device structure of claim 1, wherein the first portion has a first length and the second portion has a second length greater than the first length.

3. The semiconductor device structure of claim 2, further comprising:

a contact etch stop layer (CESL) in contact with the source/drain feature.

4. The semiconductor device structure of claim 3, wherein the top surface of the second portion of the isolation structure is in contact with the CESL.

5. The semiconductor device structure of claim 4, further comprising:

a gate dielectric layer having a first portion disposed between and in contact with the isolation structure and the gate electrode layer.

6. The semiconductor device structure of claim 5, wherein the gate dielectric layer has a second portion disposed between and in contact with the gate electrode layer and the gate spacer.

7. The semiconductor device structure of claim 5, wherein the top surface of the first portion of the isolation structure is in contact with the gate dielectric layer.

8. The semiconductor device structure of claim 1, wherein the isolation structure extends through an entire thickness of a portion of the gate spacer.

9. The semiconductor device structure of claim 1, further comprising:

a shallow trench isolation (STI) disposed over the substrate, wherein a bottom of the isolation structure extends into a portion of the STI.

10. The semiconductor device structure of claim 1, wherein the isolation structure is formed of a dielectric material.

11. A semiconductor device structure, comprising:

a semiconductor layer disposed over a substrate;

a gate electrode layer disposed to surround the semiconductor layer, the gate electrode layer extending along a first direction;

a gate dielectric layer disposed between the isolation structure and the gate electrode layer;

a first source/drain feature disposed over the substrate;

a gate spacer disposed between the gate electrode layer and the first source/drain feature; and an isolation structure extending along a second direction perpendicular to the first direction, the isolation structure having a first side, a second side opposite the first side, a third side connecting the first side to the second side, and a fourth side connecting the first side to the second side, the isolation structure comprising:

an upper portion, wherein the entire first and second sides of the upper portion are in contact with the gate dielectric layer; and a lower portion, wherein the first and second sides of the lower portion are in contact with the gate dielectric layer and the gate spacer, wherein the upper portion and the lower portion are integrally formed from a continuous material.

12. The semiconductor device structure of claim 11, wherein the entire third and fourth sides of the upper portion of the isolation structure are in contact with the gate spacer.

13. The semiconductor device structure of claim 11, further comprising:

a contact etch stop layer (CESL) disposed between the gate spacer and the first source/drain feature.

14. The semiconductor device structure of claim 13, wherein the entire third and fourth sides of the lower portion of the isolation structure are in contact with the CESL.

15. The semiconductor device structure of claim 14, wherein the CESL is in contact with the gate spacer and the third and fourth sides of the lower portion of the isolation structure.

16. The semiconductor device structure of claim 13, wherein the first and second sides of the lower portion of the isolation structure are further in contact with the CESL.

17. The semiconductor device structure of claim 16, further comprising:

a second source/drain feature disposed over the substrate, and the lower portion of the isolation structure is further extended between the first and second source/drain features.

18. A method for forming a semiconductor device structure, comprising:

depositing a stack of semiconductor layers over a substrate, the stack of the semiconductor layers comprising a plurality of first semiconductor layers and a plurality of second semiconductor layers alternatingly stacked;

forming a first fin structure and a second fin structure from the stack of semiconductor layers;

forming a shallow trench isolation (STI) around the first and second fin structure;

depositing a first sacrificial gate material over the STI;

forming an isolation structure in the first sacrificial gate material between the first and second fin structures;

patterning the first sacrificial gate material to form a sacrificial gate structure over a portion of isolation structure and the first and second fin structures;

forming a gate spacer on exposed surfaces of the sacrificial gate structure, the isolation structure, and the first and second fin structures;

performing an etch process to remove the gate spacer from horizontal surfaces of the sacrificial gate structure, the isolation structure, and the first and second fin structures;

removing portions of the first and second fin structures not covered by the sacrificial gate structure to expose a portion of the substrate;

forming a source/drain feature on opposite sides of the sacrificial gate structure;

forming sequentially a contact etch stop layer (CESL) and an interlayer dielectric (ILD) layer over the source/drain features and the isolation structure;

removing the sacrificial gate structure and the plurality of second semiconductor layers to expose portions of the plurality of first semiconductor layers and the isolation structure; and forming a gate electrode layer over the exposed portions of the plurality of first semiconductor layers and the isolation structure.

19. The method of claim 18, further comprising:

prior to forming a gate spacer on exposed surfaces of the sacrificial gate structure, removing a portion of the isolation structure not covered by the sacrificial gate structure.

20. The method of claim 18, further comprising:

after forming an isolation structure in the first sacrificial gate material, depositing a second sacrificial gate material on the first sacrificial gate material and the isolation structure.

* * * * *